(12) United States Patent  (10) Patent No.: US 12,482,795 B2
Yang  (45) Date of Patent: *Nov. 25, 2025

(54) SEMICONDUCTOR DEVICE WITH DECOUPLING CAPACITOR STRUCTURE AND METHOD FOR MANUFACTURING THE SAME

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 556 days.

This patent is subject to a terminal disclaimer.

(21) Appl. No.: 17/943,849

(22) Filed: Sep. 13, 2022

(65) Prior Publication Data

US 2024/0088111 A1  Mar. 14, 2024

(51) Int. Cl.
*H01L 25/16* (2023.01)
*H01L 21/48* (2006.01)
*H01L 21/56* (2006.01)
*H01L 23/00* (2006.01)
*H01L 23/31* (2006.01)
*H10D 1/68* (2025.01)

(52) U.S. Cl.
CPC .......... *H01L 25/16* (2013.01); *H01L 21/4853* (2013.01); *H01L 21/565* (2013.01); *H01L 23/3128* (2013.01); *H01L 24/48* (2013.01); *H10D 1/692* (2025.01); *H01L 2224/48139* (2013.01); *H01L 2224/48147* (2013.01); *H01L 2224/48227* (2013.01); *H01L 2924/1205* (2013.01)

(58) Field of Classification Search
CPC ... H01L 25/16; H01L 21/4853; H01L 21/565; H01L 23/3128; H01L 24/48; H01L 2224/48139; H01L 2224/48147; H01L 2224/48227; H01L 2924/1205; H10D 1/692

See application file for complete search history.

(56) References Cited

U.S. PATENT DOCUMENTS

| 6,407,456 B1* | 6/2002 | Ball | H01L 25/50 257/E21.705 |
| 2003/0021096 A1* | 1/2003 | Vinson | H01L 25/0655 361/783 |
| 2007/0001298 A1* | 1/2007 | Ozawa | H01L 23/50 257/E23.079 |

(Continued)

FOREIGN PATENT DOCUMENTS

| CN | 114530436 A | 5/2022 |
| TW | 202232705 A | 8/2022 |

*Primary Examiner* — Jacob Y Choi
*Assistant Examiner* — Neil R Prasad
(74) *Attorney, Agent, or Firm* — MUNCY, GEISSLER, OLDS & LOWE, P.C.

(57) ABSTRACT

A semiconductor device and method for manufacturing the same are provided. The semiconductor device includes a substrate, a decoupling capacitor structure, and an electronic component. The decoupling capacitor structure is disposed on the substrate. The electronic component is disposed on the decoupling capacitor structure and electrically connected to the decoupling capacitor structure. The electronic component is stacked over the decoupling capacitor structure.

16 Claims, 43 Drawing Sheets

(56) References Cited

U.S. PATENT DOCUMENTS

2012/0068306 A1* 3/2012 Song .................. H10D 1/692
   257/532
2018/0033774 A1* 2/2018 Kuo .................. H01L 25/0657

* cited by examiner

SEMICONDUCTOR DEVICE WITH DECOUPLING CAPACITOR STRUCTURE AND METHOD FOR MANUFACTURING THE SAME

TECHNICAL FIELD

The present disclosure relates to a semiconductor device and a method for manufacturing the same, and more particularly, to a semiconductor device including a built-in decoupling capacitor.

DISCUSSION OF THE BACKGROUND

With the rapid growth of the electronics industry, integrated circuits (ICs) have achieved high performance and miniaturization. Technological advances in IC materials and design have produced generations of ICs in which each successive generation has smaller and more complex circuits.

Many techniques have been developed to increase the performance of semiconductor devices. For example, a decoupling capacitor structure may be utilized to filter signals with a specific frequency. However, such decoupling capacitor structures may occupy additional areas, which increases the size of a semiconductor device. Therefore, improved semiconductor devices and methods of solving such problems are required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a decoupling capacitor structure, and an electronic component. The decoupling capacitor structure is disposed on the substrate. The electronic component is disposed on the decoupling capacitor structure and electrically connected to the decoupling capacitor structure. The electronic component is stacked over the decoupling capacitor structure.

Another aspect of the present disclosure provides another semiconductor device. The semiconductor device includes a substrate; a first conductive layer, a dielectric film, a second conductive layer, and an electronic component. The first conductive layer is disposed on the substrate and configured to be electrically connected to a first voltage. The dielectric film is disposed on the first conductive layer. The second conductive layer is disposed on the dielectric film and configured to be electrically connected to a second voltage different from the first voltage. The electronic component is electrically connected to the second conductive layer.

Another aspect of the present disclosure provides a method of manufacturing a semiconductor device. The method includes providing a substrate. The method also includes forming a decoupling capacitor structure on the substrate. The method further includes forming an electronic component on the decoupling capacitor structure. The electronic component is stacked on the decoupling capacitor structure.

In embodiments of the present disclosure, the semiconductor device may include a decoupling capacitor structure, which may be configured to filter signals transmitted to or from the electronic component. The electronic component may be stacked on at least a portion of the decoupling capacitor structure. The conductive patterns over a substrate may serve as a terminal of the decoupling capacitor structure. Such structure may need no additional area, resulting in a relatively small size of a semiconductor device in comparison with a comparative example.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
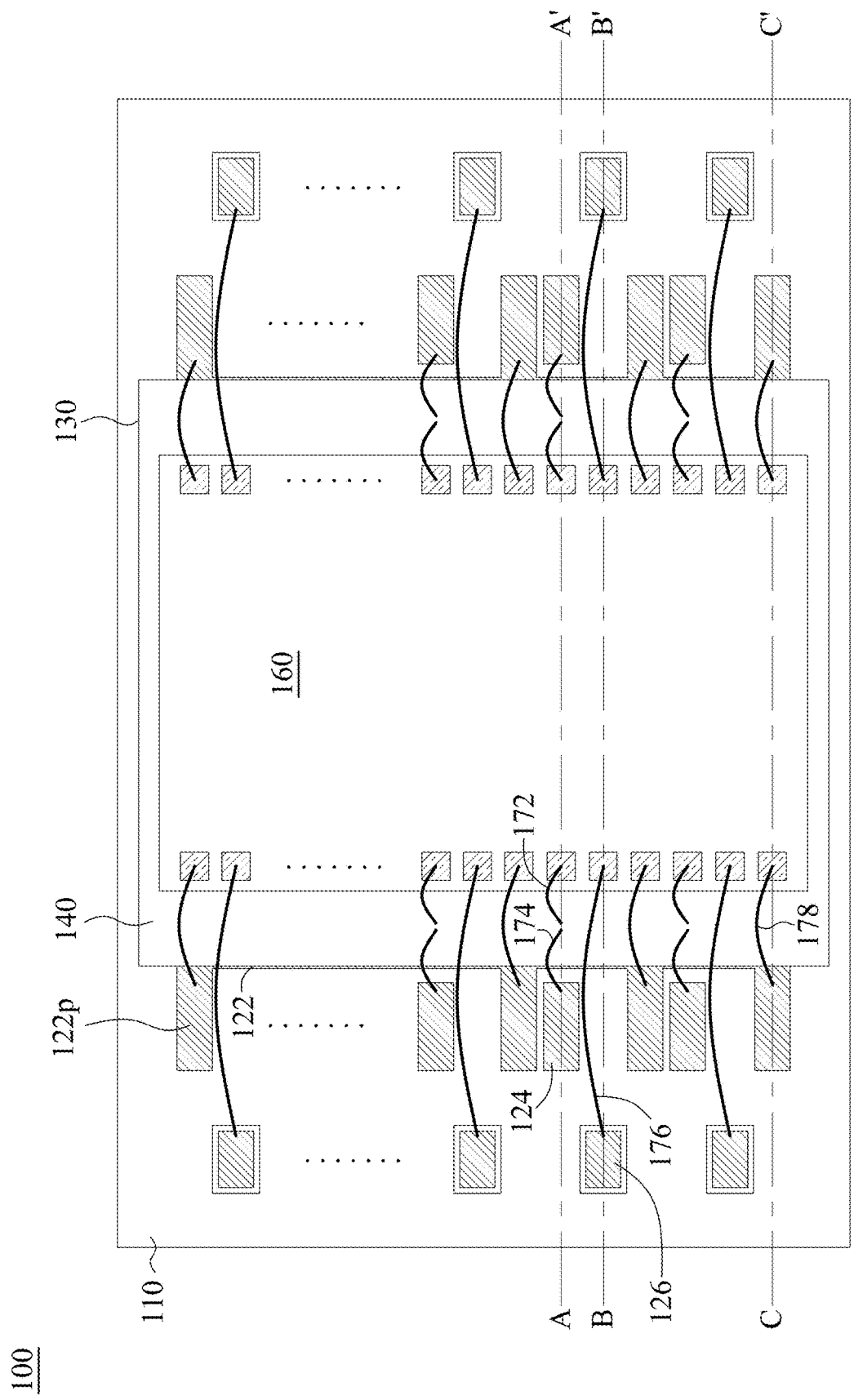
FIG. 1A is a top view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
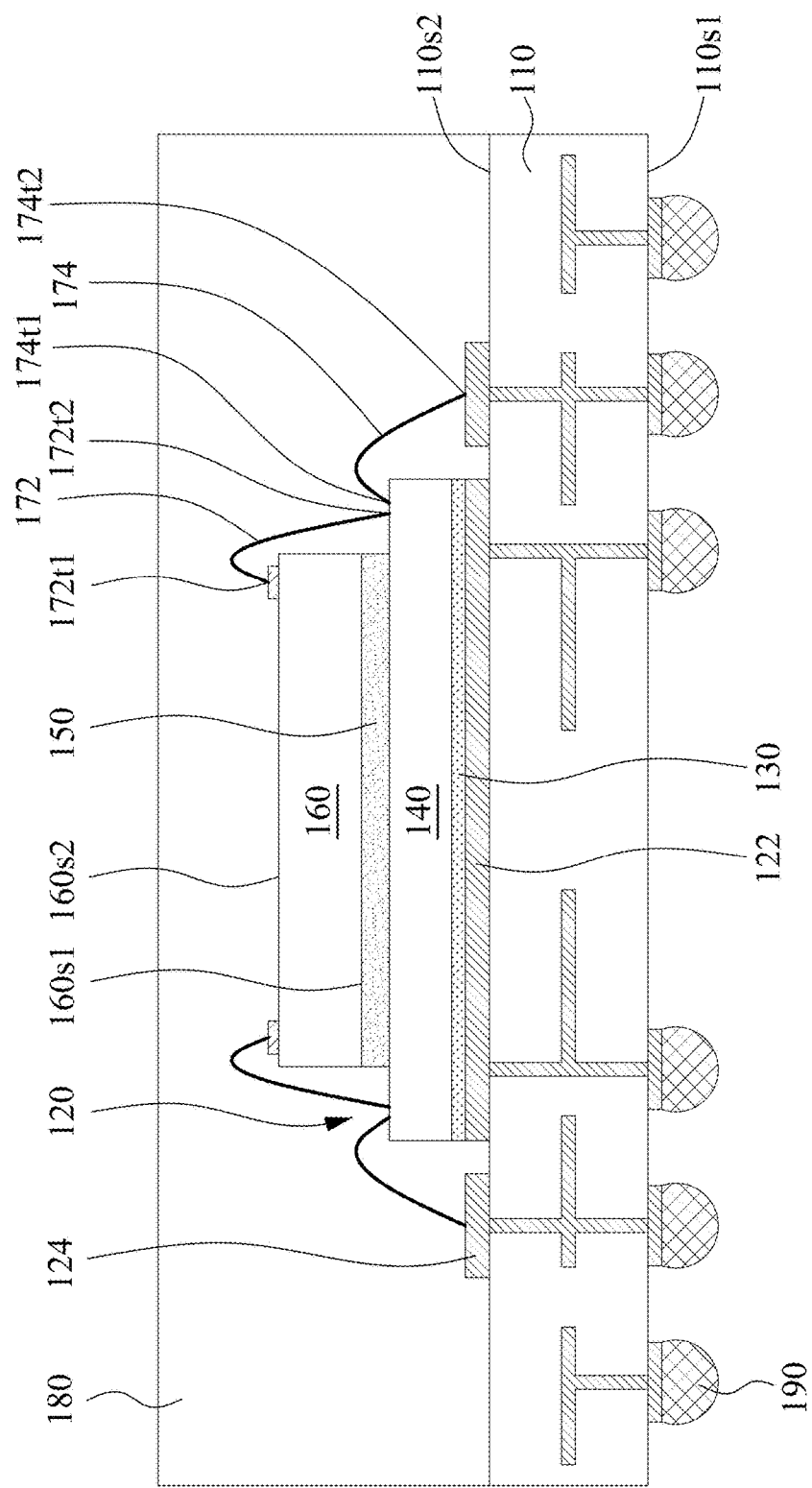
FIG. 1B is a cross-sectional view along line A-A' of the semiconductor device as shown in FIG. 1A, in accordance with some embodiments of the present disclosure.
Figure 1C:
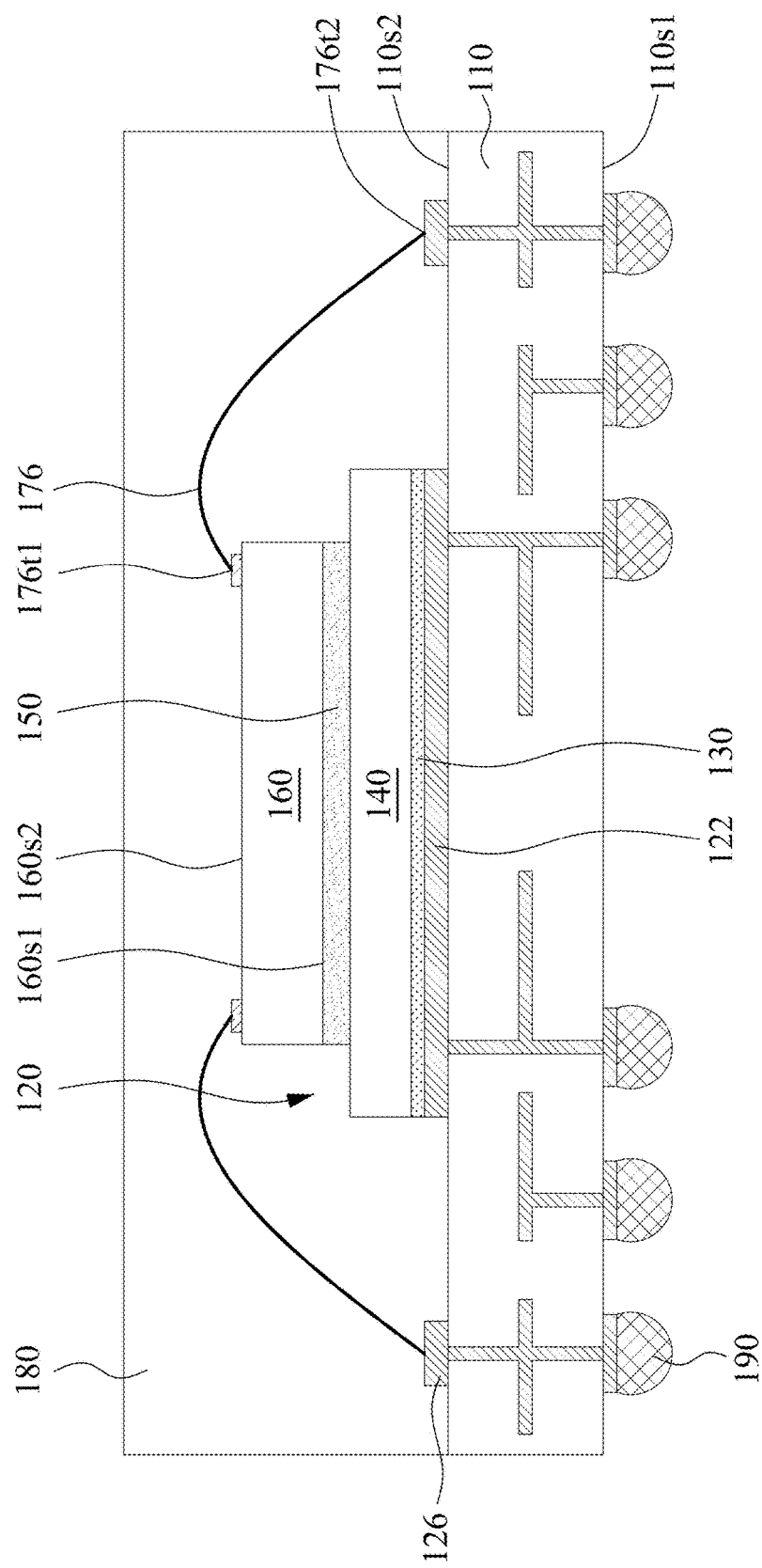
FIG. 1C is a cross-sectional view along line B-B' of the semiconductor device as shown in FIG. 1A, in accordance with some embodiments of the present disclosure.
Figure 1D:
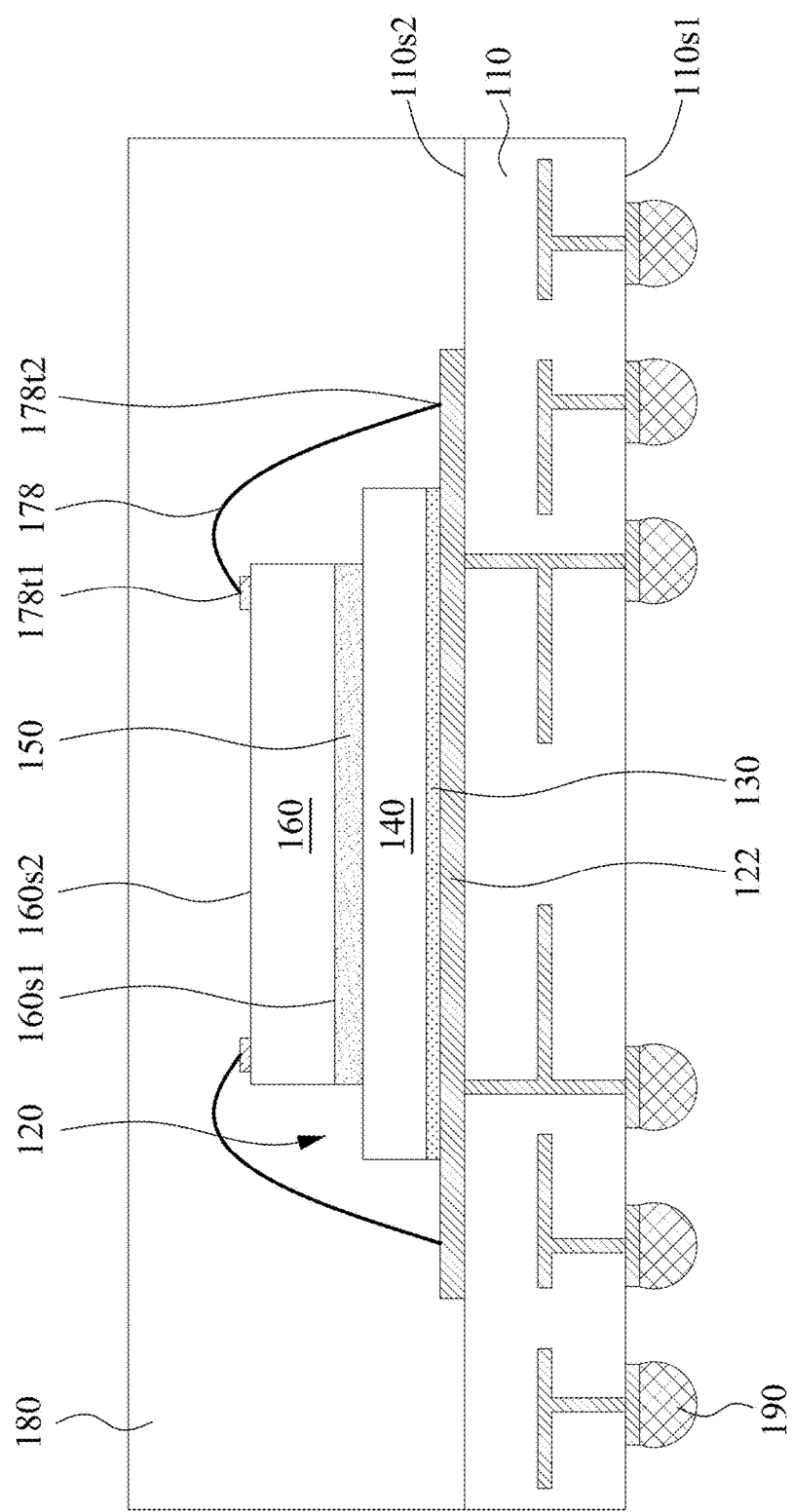
FIG. 1D is a cross-sectional view along line C-C' of the semiconductor device as shown in FIG. 1A, in accordance with some embodiments of the present disclosure.

FIG. 1A, FIG. 1B, FIG. 1C, and FIG. 1D illustrate a semiconductor device 100, in accordance with some embodiments of the present disclosure. FIG. 1A is a top view. FIG. 1B, FIG. 1C, and FIG. 1D are cross-sectional views along line A-A', B-B', and C-C' of FIG. 1A, respectively.

In some embodiments, the semiconductor device 100 may include a substrate 110, a decoupling capacitor structure 120, an adhesive layer 150, an electronic component 160, conductive wires 172, 174, 176, and 178, an encapsulant 180 as well as electrical connections 190.

In some embodiments, the semiconductor device 100 may include a substrate 110. In some embodiments, the substrate 110 may be or include, for example, a printed circuit board (PCB), such as a paper-based copper foil laminate, a composite copper foil laminate, or a polymer-impregnated glass-fiber-based copper foil laminate.

In some embodiments, the substrate 110 may include a surface 110s1 and a surface 110s2 opposite to the surface 110s1. In some embodiments, the surface 110s1 may also be referred to as a lower surface. In some embodiments, the surface 110s2 may also be referred to as an upper surface.

In some embodiments, the substrate 110 may include conductive pad(s), trace(s), via(s), layer(s), or other interconnection(s) therein. For example, the substrate 110 may include one or more transmission lines (e.g., communications cables) and one or more grounding lines and/or grounding planes therein.

In some embodiments, the decoupling capacitor structure 120 may be disposed on or over the substrate 110. In some embodiments, the decoupling capacitor structure 120 may be disposed on the surface 110s2 of the substrate 110. In some embodiments, the decoupling capacitor structure 120 may be configured to filter a predetermined frequency of a signal. In some embodiments, the decoupling capacitor structure 120 may be configured to filter a predetermined frequency of an input signal transmitted to the electronic component 160. In some embodiments, the decoupling capacitor structure 120 may be configured to filter a predetermined frequency of an output signal transmitted from the electronic component 160. In some embodiments, the decoupling capacitor structure 120 may be electrically connected to the substrate 110. In some embodiments, the decoupling capacitor structure 120 may be electrically connected to the electronic component 160. In some embodiments, the decoupling capacitor structure 120 may include a conductive layer 122, a dielectric film 130, and a conductive layer 140.

In some embodiments, the conductive layer 122 may be disposed on or over the substrate 110. In some embodiments, the conductive layer 122 may be electrically connected to ground. In some embodiments, the conductive layer 122 may be electrically connected to real ground. In some embodiments, the conductive layer 122 may be electrically connected to virtual ground. The conductive layer 122 may be electrically connected to a power supply VSS. In some embodiments, the conductive layer 122 may serve as a terminal (e.g., electrode) of the decoupling capacitor structure 120. In some embodiments, as shown in FIG. 1A, the conductive layer 122 may include a plurality of extending portions 122p. In some embodiments, the extending portion 122p of the conductive layer 122 may extend toward an edge of the substrate 110. The conductive layer 122 may include a conductive material, such as copper (Cu), tungsten (W), silver (Ag), gold (Au), ruthenium (Ru), iridium (Ir), nickel (Ni), osmium (Os), rhodium (Rh), aluminum (Al), molybdenum (Mo), cobalt (Co), alloys thereof, combinations thereof or other suitable materials.

In some embodiments, the dielectric film 130 may be disposed on the conductive layer 122. In some embodiments, the dielectric film 130 may be disposed between the conductive layer 122 and the conductive layer 140. In some embodiments, the dielectric film 130 may include a dielectric material, such as silicon oxide ($SiO_2$), silicon nitride ($Si_3N_4$), silicon oxynitride ($N_2OSi_2$), silicon nitride oxide ($N_2OSi_2$), a high-k material or combinations thereof. Examples of the high-k material include a dielectric material having a dielectric constant that is higher than that of silicon dioxide ($SiO_2$), or a dielectric material having a dielectric constant higher than about 3.9. In some embodiments, the dielectric film 130 may include at least one metallic element, such as hafnium oxide ($HfO_2$), silicon doped hafnium oxide (HSO), lanthanum oxide ($La_2O_3$), lanthanum aluminum oxide ($LaAlO_3$), zirconium orthosilicate ($ZrSiO_4$), aluminum oxide ($Al_2O_3$) or combinations thereof.

In some embodiments, the conductive layer 140 may be disposed on the dielectric film 130. In some embodiments, the conductive layer 140 may be electrically connected to a conductive pad 124, which is disposed on the substrate 110. In some embodiments, the conductive layer 140 may be electrically connected to a voltage (or a power supply) greater than 0. In some embodiments, the conductive layer 140 may serve as a terminal (e.g., electrode) of the decoupling capacitor structure 120. The conductive layer 140 may include a conductive material, such as aluminum (Al), copper (Cu), tungsten (W), silver (Ag), gold (Au), ruthenium (Ru), iridium (Ir), nickel (Ni), osmium (Os), rhodium (Rh), molybdenum (Mo), cobalt (Co), alloys thereof, combinations thereof or other suitable materials. In some embodiments, the material of the conductive layer 140 may be different from that of the conductive layer 122.

In some embodiments, the semiconductor device 100 may include conductive pads 124 and 126. In some embodiments, the conductive pad 124 may be located at a height (or a level) which is the same as that of the conductive layer 122. In some embodiments, the conductive pad 126 may be located at a height (or a level) which is the same as that of the conductive layer 122. The conductive pad 124 may be electrically connected to a first voltage. The conductive pad 126 may be electrically connected to a second voltage different from the first voltage. In some embodiments, the conductive pad 124 may be electrically connected to a power supply VDD. In some embodiments, the decoupling capacitor structure 120 may be electrically connected between the power supply VSS and the power supply VDD. The conductive pad 126 may be configured to transmit a data signal.

In some embodiments, the adhesive layer 150 may be disposed on or over the decoupling capacitor structure 120. In some embodiments, the adhesive layer 150 may be disposed on the conductive layer 140.

In some embodiments, the electronic component 160 may be disposed on the surface 110s2 of the substrate 110. In some embodiments, the electronic component 160 may be disposed on the decoupling capacitor structure 120. In some embodiments, the electronic component 160 may be disposed on the conductive layer 140. In some embodiments, the electronic component 160 may be attached to the decoupling capacitor structure 120 through the adhesive layer 150. In some embodiments, the conductive layer 122, the dielectric film 130, the conductive layer 140, and the electronic component 160 may be stacked over the substrate 110.

In some embodiments, the electronic component 160 may include a memory device, such as a dynamic random access memory (DRAM) device, a one-time programming (OTP)

memory device, a static random access memory (SRAM) device, or other suitable memory devices. In some embodiments, the electronic component 160 may include a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices.

The electronic component 160 may have a surface 160s1 and a surface 160s2 opposite to the surface 160s1. In some embodiments, the surface 160s1 may also be referred to as a backside surface or a lower surface. In some embodiments, the surface 160s2 may also be referred to as an active surface or an upper surface. As used herein, the term "active surface" may refer to a surface on which a terminal(s) is disposed for transmitting and/or receiving signals. In some embodiments, the surface 160s1 of the electronic component 160 may face the surface 110s2 of the substrate 110.

In some embodiments, the electronic component 160 may include a plurality of terminals (not annotated in the figures), which may be configured to receive and/or transmit different signals, such as data signals and power signals.

The conductive wires 172, 174, 176, and 178 may include metal, such as copper (Cu), silver (Ag), gold (Au), nickel (Ni), aluminum (Al), alloys thereof, combinations thereof, or other suitable materials.

In some embodiments, as shown in FIG. 1B, the conductive wire 172 may electrically connect the conductive layer 140 and the electronic component 160. In some embodiments, the conductive wire 172 may have a terminal 172t1 connected to (or bonded to) the surface 160s2 of the electronic component 160 and a terminal 172t2 connected to (or bonded to) the conductive layer 140 of the decoupling capacitor structure 120.

In some embodiments, as shown in FIG. 1B, the conductive wire 174 may electrically connect the conductive pad 124 and the conductive layer 140. In some embodiments, the conductive wire 174 may have a terminal 174t1 connected to (or bonded to) the conductive layer 140 and a terminal 174t2 connected to (or bonded to) the conductive pad 124.

In some embodiments, as shown in FIG. 1C, the conductive wire 176 may electrically connect the conductive pad 126 and the electronic component 160. In some embodiments, the conductive wire 176 may have a terminal 176t1 connected to (or bonded to) the electronic component 160 and a terminal 176t2 connected to (or bonded to) the conductive pad 126.

In some embodiments, as shown in FIG. 1D, the conductive wire 178 may electrically connect the electronic component 160 and the conductive layer 122. In some embodiments, the conductive wire 178 may have a terminal 178t1 connected to (or bonded to) the electronic component 160 and a terminal 178t2 connected to (or bonded to) the conductive layer 122. In some embodiments, the conductive wire 178 may be disposed on the extending portion 122p of the conductive layer 122.

In some embodiments, the encapsulant 180 may be disposed on the surface 110s2 of the substrate 110. In some embodiments, the encapsulant 180 may cover the surface 110s2 of the substrate 110. In some embodiments, the encapsulant 180 may encapsulate the decoupling capacitor structure 120. In some embodiments, the encapsulant 180 may encapsulate the electronic component 160. In some embodiments, the encapsulant 180 may encapsulate the conductive wire 172. In some embodiments, the encapsulant 180 may encapsulate the conductive wire 174. In some embodiments, the encapsulant 180 may encapsulate the conductive wire 176. In some embodiments, the encapsulant 180 may encapsulate the conductive wire 178. The encapsulant 180 may include insulative or dielectric material. In some embodiments, the encapsulant 180 may be made of molding material that may include, for example, a Novolac-based resin, an epoxy-based resin, a silicone-based resin, or another suitable encapsulant. Suitable fillers may also be included, such as powdered $SiO_2$.

The electrical connection 190 may be disposed on the surface 110s1 of the substrate 110. In some embodiments, the electrical connection 190 may be configured to electrically connect the semiconductor device 100 and an external device (not shown). In some embodiments, the electrical connection 190 may include solder material, such as alloys of gold and tin solder or alloys of silver and tin solder.

In a comparative example, a decoupling capacitor structure is an external device electrically connected to an electronic component through solders or a circuit board. However, such decoupling capacitor structure may occupy an additional area, increasing the size of a comparative semiconductor device. In embodiments of the present disclosure, an electronic component (e.g., 160) is integrated with or stacked over a decoupling capacitor structure (e.g., 120). The conductive patterns on a substrate may serve as a terminal (e.g., 122) of the decoupling capacitor structure. Such structure may need no additional area, resulting in a relatively small size of a semiconductor device (e.g., 100) in comparison with a comparative example.

Figure 2:
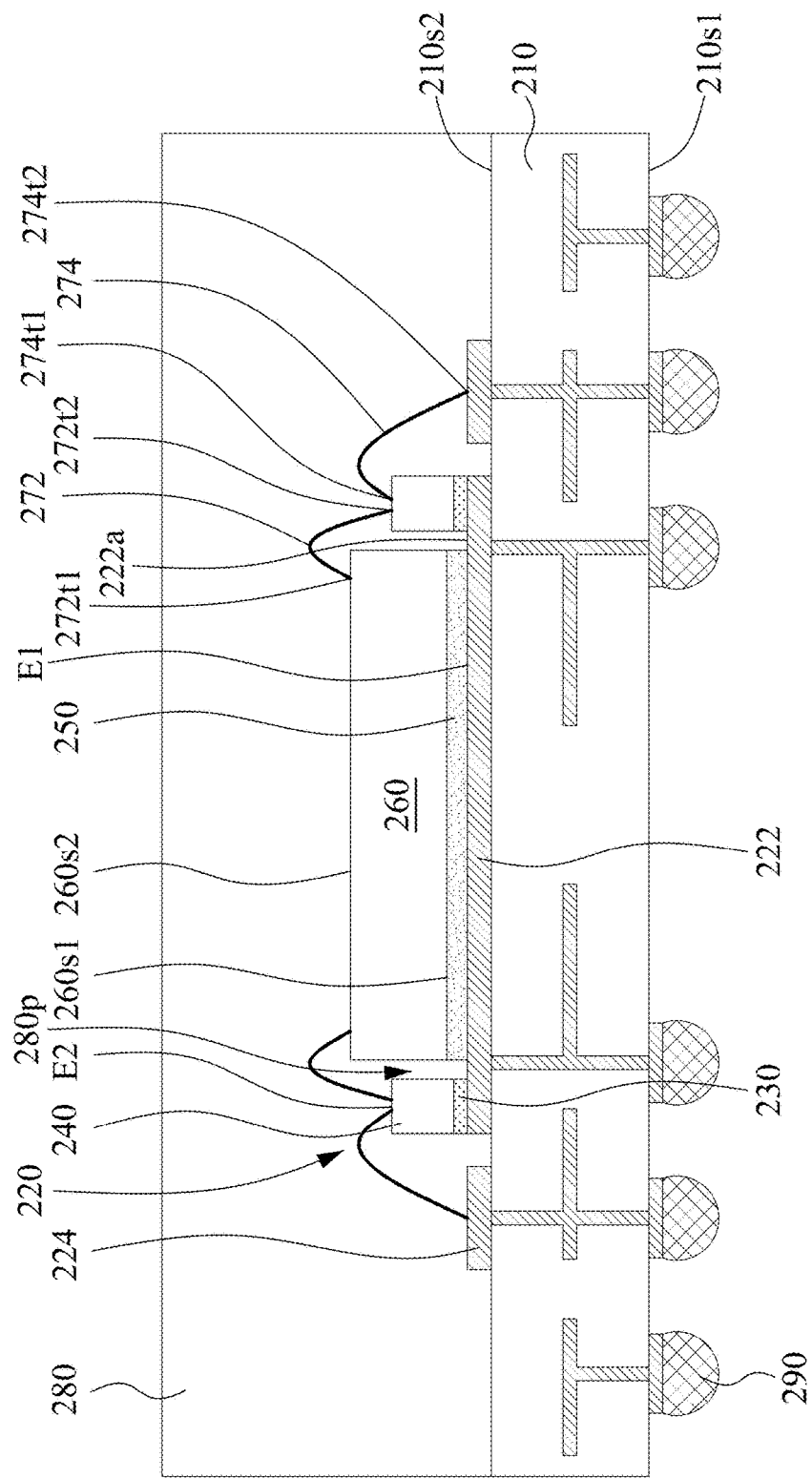
FIG. 2 is a cross-sectional view of a semiconductor device, in accordance with some embodiments of the present disclosure.

FIG. 2 is a cross-sectional view of a semiconductor device 200, in accordance with some embodiments of the present disclosure.

In some embodiments, the semiconductor device 200 may include a substrate 210, a decoupling capacitor structure 220, an adhesive layer 250, an electronic component 260, conductive wires 272 and 274, an encapsulant 280 as well as electrical connections 290.

In some embodiments, the substrate 210 may be or include, for example, a printed circuit board (PCB), such as a paper-based copper foil laminate, a composite copper foil laminate, or a polymer-impregnated glass-fiber-based copper foil laminate.

In some embodiments, the substrate 210 may include a surface 210s1 and a surface 210s2 opposite to the surface 210s1. In some embodiments, the surface 210s1 may also be referred to as a lower surface. In some embodiments, the surface 210s2 may also be referred to as an upper surface.

In some embodiments, the decoupling capacitor structure 220 may be disposed on the substrate 210. In some embodiments, the decoupling capacitor structure 220 may be disposed on the surface 210s2 of the substrate 210. In some embodiments, the decoupling capacitor structure 220 may be configured to filter a predetermined frequency of a signal. In some embodiments, the decoupling capacitor structure 220 may be configured to filter a predetermined frequency of an input signal transmitted to the electronic component 260. In some embodiments, the decoupling capacitor structure 220 may be configured to filter a predetermined frequency of an output signal transmitted from the electronic component 260. In some embodiments, the electronic component 260 may be electrically connected to the substrate 210. In some embodiments, the decoupling capacitor structure 220 may be electrically connected to the electronic component 260. In some embodiments, the decoupling capacitor structure 220 may include a conductive layer 222, a dielectric film 230, and a conductive layer 240.

In some embodiments, the conductive layer 222 may be disposed on the substrate 210. In some embodiments, the conductive layer 222 may be electrically connected to ground. The conductive layer 222 may be electrically connected to a power supply VSS. In some embodiments, the conductive layer 222 may be electrically connected to real ground. In some embodiments, the conductive layer 222 may be electrically connected to virtual ground. In some embodiments, the conductive layer 222 may serve as a terminal (e.g., electrode) of the decoupling capacitor structure 220.

In some embodiments, the dielectric film 230 may be disposed on the conductive layer 222. In some embodiments, the dielectric film 230 may be disposed between the conductive layer 222 and the conductive layer 240. In some embodiments, the dielectric film 230 may surround the electronic component 260. In some embodiments, the dielectric film 230 may have a ring-shaped profile from a top view. In some embodiments, a portion 222a of the conductive layer 222 may be exposed from the dielectric film 230. In some embodiments, the dielectric film 230 may include a high-k material, such as hafnium oxide ($HfO_2$), silicon doped hafnium oxide (HSO), lanthanum oxide ($La_2O_3$), lanthanum aluminum oxide ($LaAlO_3$), zirconium orthosilicate ($ZrSiO_4$), aluminum oxide ($Al_2O_3$) or combinations thereof.

In some embodiments, the conductive layer 240 may be disposed on the dielectric film 230. In some embodiments, a surface area E1 of the conductive layer 220 may be different from a surface area E2 of the conductive layer 240. In some embodiments, the conductive layer 240 may be electrically connected to a conductive pad 224. In some embodiments, the conductive pad 224 may be electrically connected to a power supply VDD. In some embodiments, the conductive layer 240 may surround the electronic component 260. In some embodiments, the conductive layer 240 may have a ring-shaped profile from a top view. In some embodiments, a portion 222a of the conductive layer 222 may be exposed from the conductive layer 240. In some embodiments, the conductive layer 240 may serve as a terminal (e.g., electrode) of the decoupling capacitor structure 220. In some embodiments, the decoupling capacitor structure 220 may be electrically connected between the power supply VSS and the power supply VDD.

In some embodiments, the adhesive layer 250 may be disposed on the decoupling capacitor structure 220. In some embodiments, the adhesive layer 250 may be disposed on the conductive layer 222. In some embodiments, the adhesive layer 250 may be in contact with the conductive layer 222.

In some embodiments, the electronic component 260 may be disposed on the surface 210s2 of the substrate 210. In some embodiments, the electronic component 260 may be disposed on the decoupling capacitor structure 220. In some embodiments, the electronic component 260 may be disposed on the conductive layer 222. In some embodiments, the conductive layer 222 and the electronic component 260 may be stacked over the substrate 210.

In some embodiments, the electronic component 260 may include a memory device, such as a dynamic random access memory (DRAM) device, a one-time programming (OTP) memory device, a static random access memory (SRAM) device, or other suitable memory devices.

The electronic component 260 may have a surface 260s1 and a surface 260s2 opposite to the surface 260s1. In some embodiments, the surface 260s1 may also be referred to as a backside surface or a lower surface. In some embodiments, the surface 260s2 may also be referred to as an active surface or an upper surface.

In some embodiments, the electronic component 260 may include a plurality of terminals (not shown), which may be configured to receive and/or transmit different signals, such as data signals and power signals.

The conductive wires 272 and 274 may include metal, such as copper (Cu), silver (Ag), gold (Au), nickel (Ni), aluminum (Al), alloys thereof, combinations thereof, or other suitable materials.

In some embodiments, the conductive wire 272 may electrically connect the conductive layer 240 and the electronic component 260. In some embodiments, the conductive wire 272 may have a terminal 272t1 connected to (or bonded to) the surface 260s2 of the electronic component 260 and a terminal 272t2 connected to (or bonded to) the conductive layer 240 of the decoupling capacitor structure 220.

In some embodiments, the conductive wire 274 may electrically connect the conductive pad 224 and the conductive layer 240. In some embodiments, the conductive wire 274 may have a terminal 274t1 connected to (or bonded to) the conductive layer 240 and a terminal 274t2 connected to (or bonded to) the conductive pad 224.

In some embodiments, the encapsulant 280 may be disposed on the surface 210s2 of the substrate 210. In some embodiments, the encapsulant 280 may cover the surface 210s2 of the substrate 210. In some embodiments, the encapsulant 280 may encapsulate the decoupling capacitor structure 220. In some embodiments, the encapsulant 280 may encapsulate the electronic component 260. In some embodiments, the encapsulant 280 may encapsulate the conductive wire 272. In some embodiments, the encapsulant 280 may encapsulate the conductive wire 274. In some embodiments, a portion 280p of the encapsulant 280 may be disposed between the dielectric film 230 and the electronic component 260. In some embodiments, a portion 280p of the encapsulant 280 may be disposed between the conductive layer 240 and the electronic component 260. In some embodiments, the encapsulant 280 may be made of molding material that may include, for example, a Novolac-based resin, an epoxy-based resin, a silicone-based resin, or another suitable encapsulant. Suitable fillers may also be included, such as powdered SiO 2.

The electrical connection 290 may be disposed on the surface 210s1 of the substrate 210. In some embodiments, the electrical connection 290 may be configured to electrically connect the semiconductor device 200 and an external device (not shown). In some embodiments, the electrical connection 290 may include solder material, such as alloys of gold and tin solder or alloys of silver and tin solder.

In embodiments of the present disclosure, an electronic component (e.g., 260) is integrated with or stacked on a decoupling capacitor structure (e.g., 220). The conductive patterns on a substrate may serve as a terminal (e.g., 222) of the decoupling capacitor structure. Such structure may need no additional area, resulting in a relatively small size of a semiconductor device (e.g., 200) in comparison with a comparative example.

Figure 3:
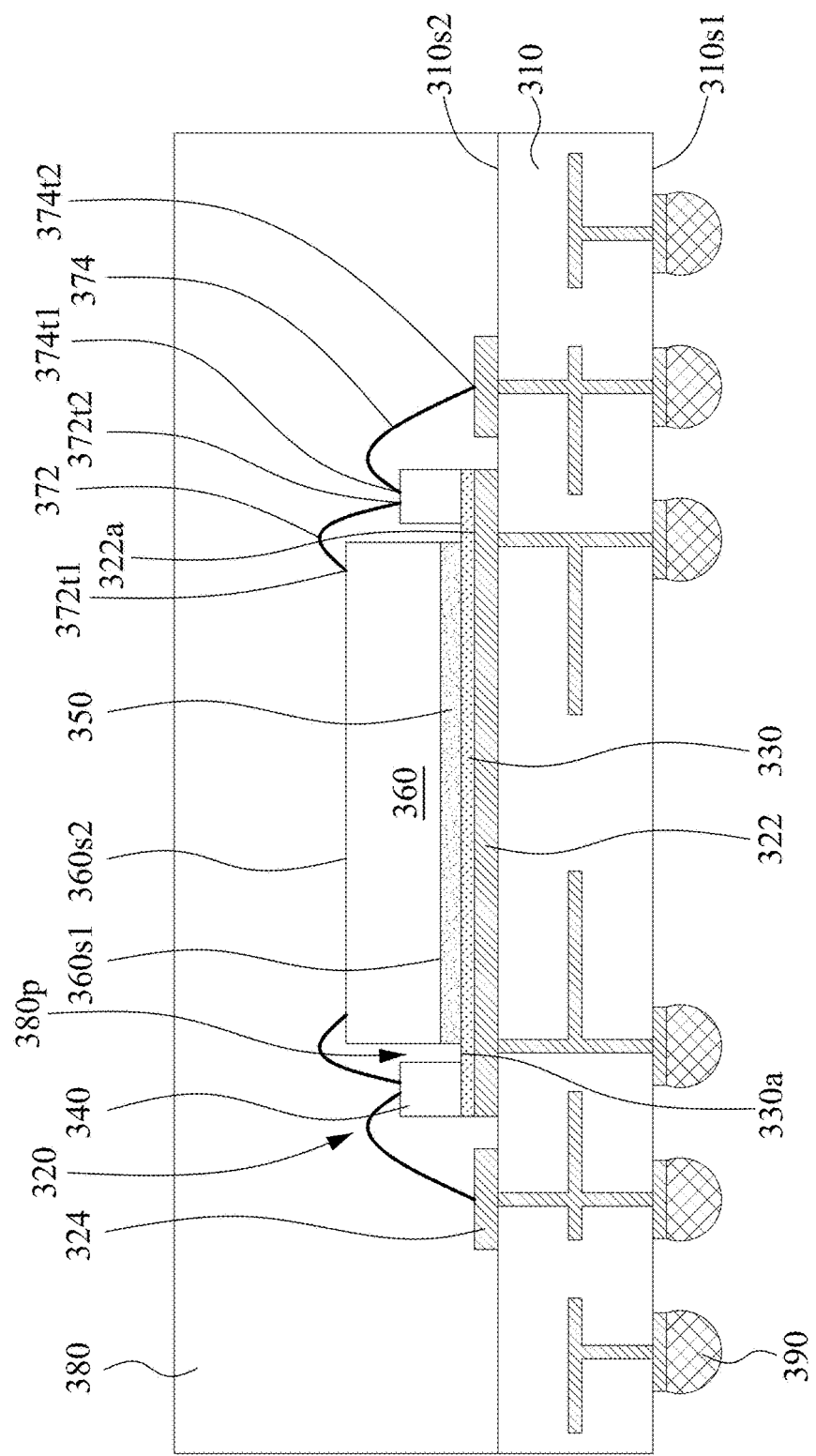
FIG. 3 is a cross-sectional view of a semiconductor device, in accordance with some embodiments of the present disclosure.

FIG. 3 is a cross-sectional view of a semiconductor device 300, in accordance with some embodiments of the present disclosure.

In some embodiments, the semiconductor device 300 may include a substrate 310, a decoupling capacitor structure 320, an adhesive layer 350, an electronic component 360, conductive wires 372 and 374, an encapsulant 380 as well as electrical connections 390.

In some embodiments, the substrate 310 may be or include, for example, a printed circuit board (PCB), such as a paper-based copper foil laminate, a composite copper foil laminate, or a polymer-impregnated glass-fiber-based copper foil laminate.

In some embodiments, the substrate 310 may include a surface 310s1 and a surface 310s2 opposite to the surface 310s1. In some embodiments, the surface 310s1 may also be referred to as a lower surface. In some embodiments, the surface 310s2 may also be referred to as an upper surface.

In some embodiments, the decoupling capacitor structure 320 may be disposed on the substrate 310. In some embodiments, the decoupling capacitor structure 320 may be disposed on the surface 310s2 of the substrate 310. In some embodiments, the decoupling capacitor structure 320 may be configured to filter a predetermined frequency of a signal. In some embodiments, the decoupling capacitor structure 320 may be configured to filter a predetermined frequency of an input signal transmitted to the electronic component 360. In some embodiments, the decoupling capacitor structure 320 may be configured to filter a predetermined frequency of an output signal transmitted from the electronic component 360. In some embodiments, the electronic component 360 may be electrically connected to the substrate 310. In some embodiments, the decoupling capacitor structure 320 may be electrically connected to the electronic component 360. In some embodiments, the electronic component 360 may include a conductive layer 322, a dielectric film 330, and a conductive layer 340.

In some embodiments, the conductive layer 322 may be disposed on the substrate 310. In some embodiments, the conductive layer 322 may be electrically connected to ground. The conductive layer 322 may be electrically connected to a power supply VSS. In some embodiments, the conductive layer 322 may be electrically connected to real ground. In some embodiments, the conductive layer 322 may be electrically connected to virtual ground. In some embodiments, the conductive layer 322 may serve as a terminal (e.g., electrode) of the decoupling capacitor structure 320.

In some embodiments, the dielectric film 330 may be disposed on the conductive layer 322. In some embodiments, the dielectric film 330 may be disposed between the conductive layer 322 and the conductive layer 340. In some embodiments, the dielectric film 330 may include a high-k material, such as hafnium oxide ($HfO_2$), silicon doped hafnium oxide (HSO), lanthanum oxide ($La_2O_3$), lanthanum aluminum oxide ($LaAlO_3$), zirconium orthosilicate ($ZrSiO_4$), aluminum oxide ($Al_2O_3$) or combinations thereof.

In some embodiments, the conductive layer 340 may be disposed on the dielectric film 330. In some embodiments, the conductive layer 340 may be electrically connected to a conductive pad 324. In some embodiments, the conductive pad 324 may be electrically connected to a power supply VDD. In some embodiments, the conductive layer 340 may surround the electronic component 360. In some embodiments, the conductive layer 340 may have a ring-shaped profile from a top view. In some embodiments, a portion 322a of the conductive layer 322 may be exposed from the conductive layer 340. In some embodiments, a portion 330a of the dielectric film 330 may be exposed from the conductive layer 340. In some embodiments, the conductive layer 340 may serve as a terminal (e.g., electrode) of the decoupling capacitor structure 320. In some embodiments, the decoupling capacitor structure 320 may be electrically connected between the power supply VSS and the power supply VDD.

In some embodiments, the adhesive layer 350 may be disposed on the decoupling capacitor structure 320. In some embodiments, the adhesive layer 350 may be disposed on the dielectric film 330. In some embodiments, the adhesive layer 350 may be in contact with the dielectric film 330.

In some embodiments, the electronic component 360 may be disposed on the surface 310s2 of the substrate 310. In some embodiments, the electronic component 360 may be disposed on the decoupling capacitor structure 320. In some embodiments, the electronic component 360 may be disposed on the conductive layer 322. In some embodiments, the conductive layer 322 and the electronic component 360 may be stacked over the substrate 310. In some embodiments, the electronic component 360 may be free from vertically overlapping the conductive layer 340.

In some embodiments, the electronic component 360 may include a memory device, such as a dynamic random access memory (DRAM) device, a one-time programming (OTP) memory device, a static random access memory (SRAM) device, or other suitable memory devices.

The electronic component 360 may have a surface 360s1 and a surface 360s2 opposite to the surface 360s1. In some embodiments, the surface 360s1 may also be referred to as a backside surface or a lower surface. In some embodiments, the surface 360s2 may also be referred to as an active surface or an upper surface.

In some embodiments, the electronic component 360 may include a plurality of terminals (not shown), which may be configured to receive and/or transmit different signals, such as data signals and power signals.

The conductive wires 372 and 374 may include metal, such as copper (Cu), silver (Ag), gold (Au), nickel (Ni), aluminum (Al), alloys thereof, combinations thereof, or other suitable materials.

In some embodiments, the conductive wire 372 may electrically connect the conductive layer 340 and the electronic component 360. In some embodiments, the conductive wire 372 may have a terminal 372t1 connected to (or bonded to) the surface 360s2 of the electronic component 360 and a terminal 372t2 connected to (or bonded to) the conductive layer 340 of the decoupling capacitor structure 320.

In some embodiments, the conductive wire 374 may electrically connect the conductive pad 324 and the conductive layer 340. In some embodiments, the conductive wire 374 may have a terminal 374t1 connected to (or bonded to) the conductive layer 340 and a terminal 374t2 connected to (or bonded to) the conductive pad 324.

In some embodiments, the encapsulant 380 may be disposed on the surface 310s2 of the substrate 310. In some embodiments, the encapsulant 380 may cover the surface 310s2 of the substrate 310. In some embodiments, the encapsulant 380 may encapsulate the decoupling capacitor structure 320. In some embodiments, the encapsulant 380 may encapsulate the electronic component 360. In some embodiments, the encapsulant 380 may encapsulate the conductive wire 372. In some embodiments, the encapsulant 380 may encapsulate the conductive wire 374. In some embodiments, a portion 380p of the encapsulant 380 may be disposed between the conductive layer 340 and the adhesive layer 350. In some embodiments, a portion 380p of the encapsulant 380 may be disposed between the conductive layer 340 and the electronic component 360. In some embodiments, the encapsulant 380 may be made of molding material that may include, for example, a Novolac-based resin, an epoxy-based resin, a silicone-based resin, or another suitable encapsulant. Suitable fillers may also be included, such as powdered $SiO_2$.

The electrical connection 390 may be disposed on the surface 310s1 of the substrate 310. In some embodiments, the electrical connection 390 may be configured to electrically connect the semiconductor device 300 and an external device (not shown). In some embodiments, the electrical connection 390 may include solder material, such as alloys of gold and tin solder or alloys of silver and tin solder.

In embodiments of the present disclosure, a decoupling capacitor structure (e.g., 320) is integrated with an electronic component (e.g., 360). The conductive patterns on a substrate may serve as a terminal (e.g., 322) of the decoupling capacitor structure. Such structure may need no additional area, resulting in a relatively small size of a semiconductor device (e.g., 300) in comparison with a comparative example.

Figure 4:
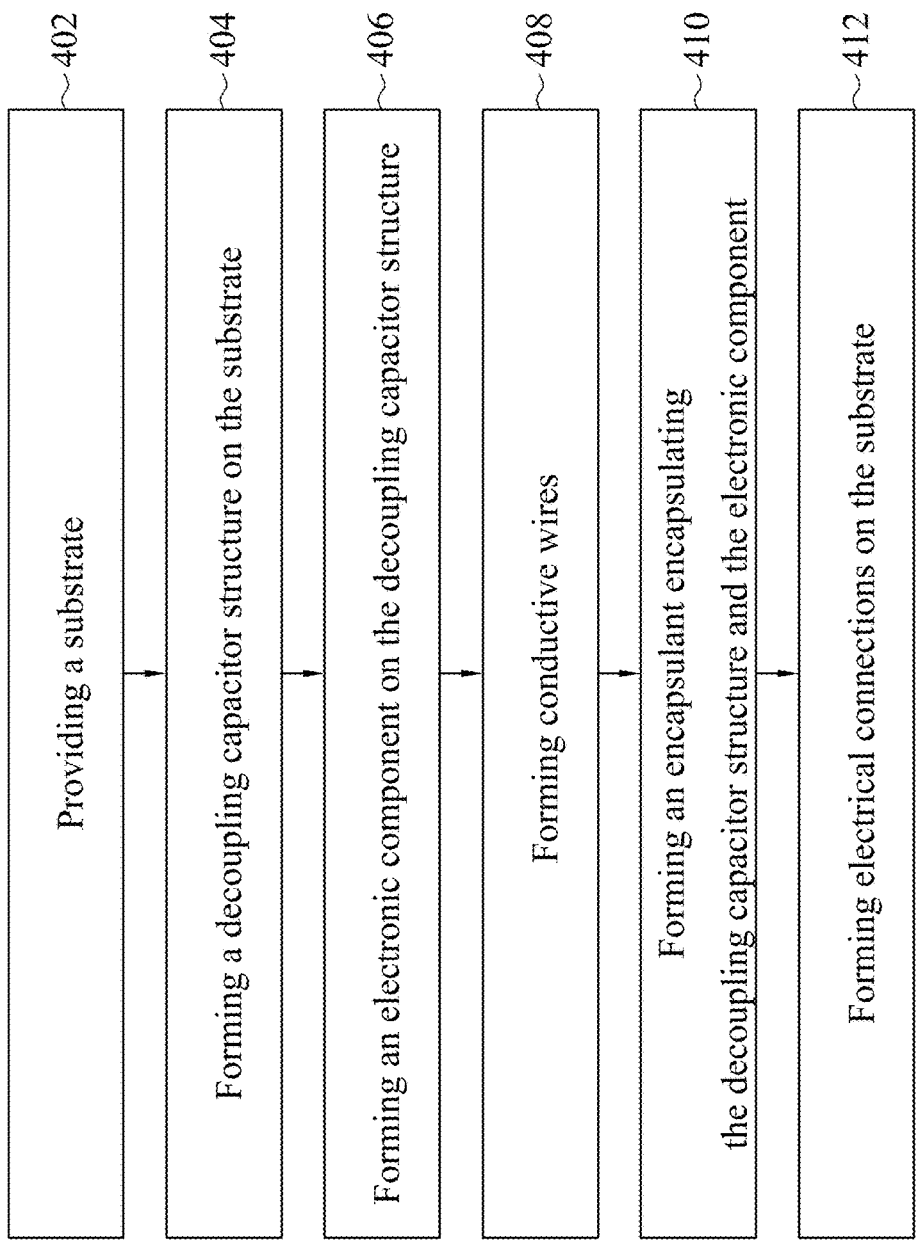
FIG. 4 is a flowchart illustrating a method of manufacturing a semiconductor device, in accordance with some embodiments of the present disclosure.
Figure 5A:
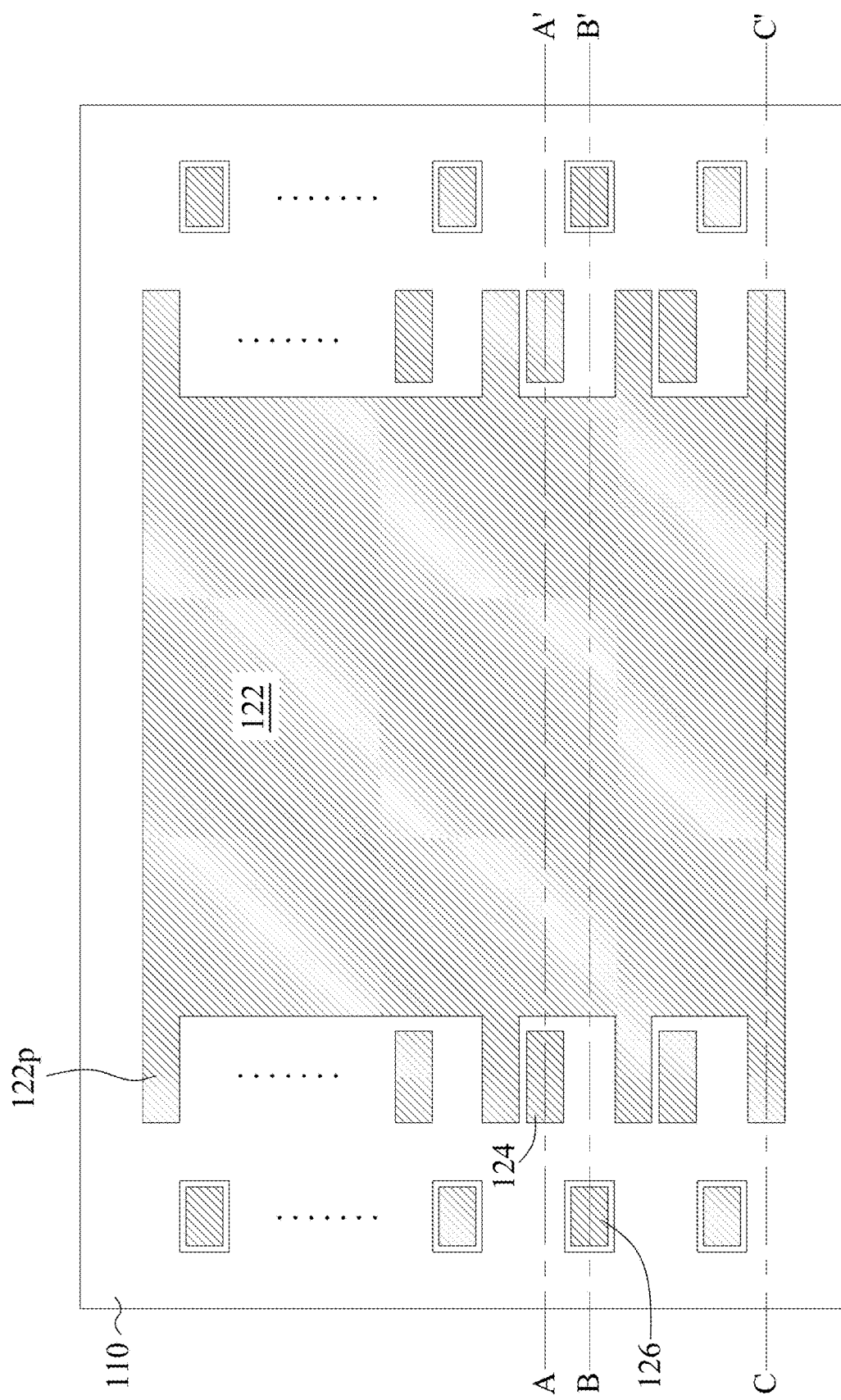
FIG. 5A illustrates one or more stages of an exemplary method for manufacturing a semiconductor device according to some embodiments of the present disclosure.
Figure 5B:
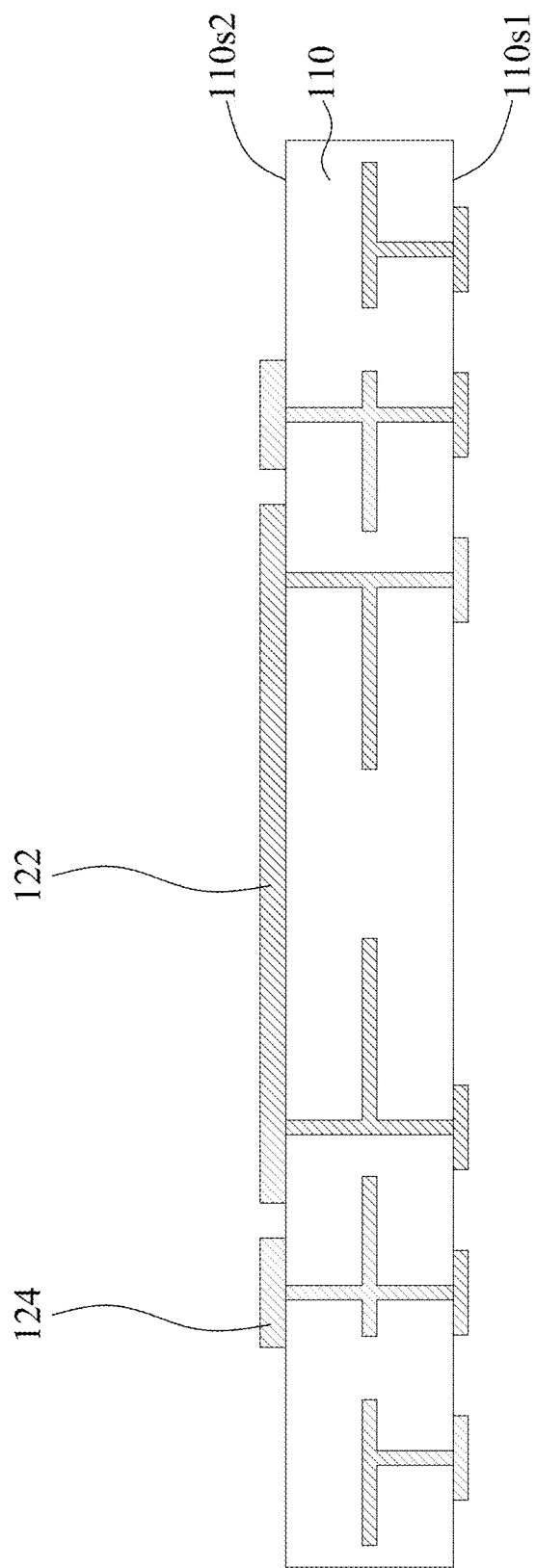
FIG. 5B is a cross-sectional view along line A-A' of the stage as shown in FIG. 5A, in accordance with some embodiments of the present disclosure.
Figure 5C:
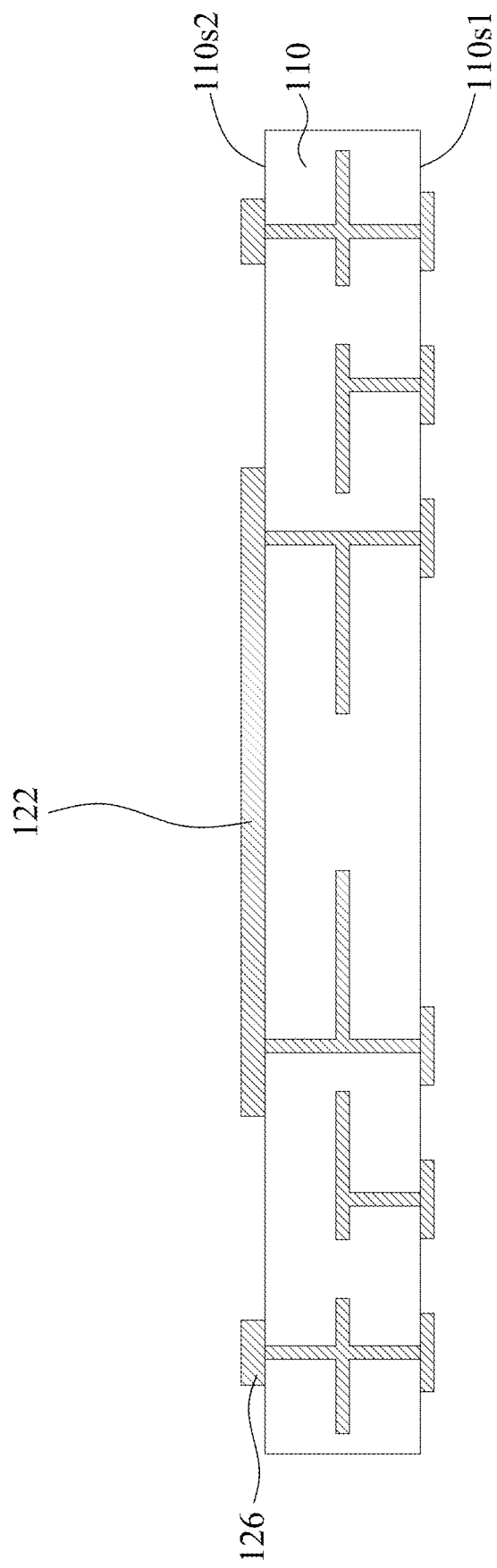
FIG. 5C is a cross-sectional view along line B-B' of the stage as shown in FIG. 5A, in accordance with some embodiments of the present disclosure.
Figure 5D:
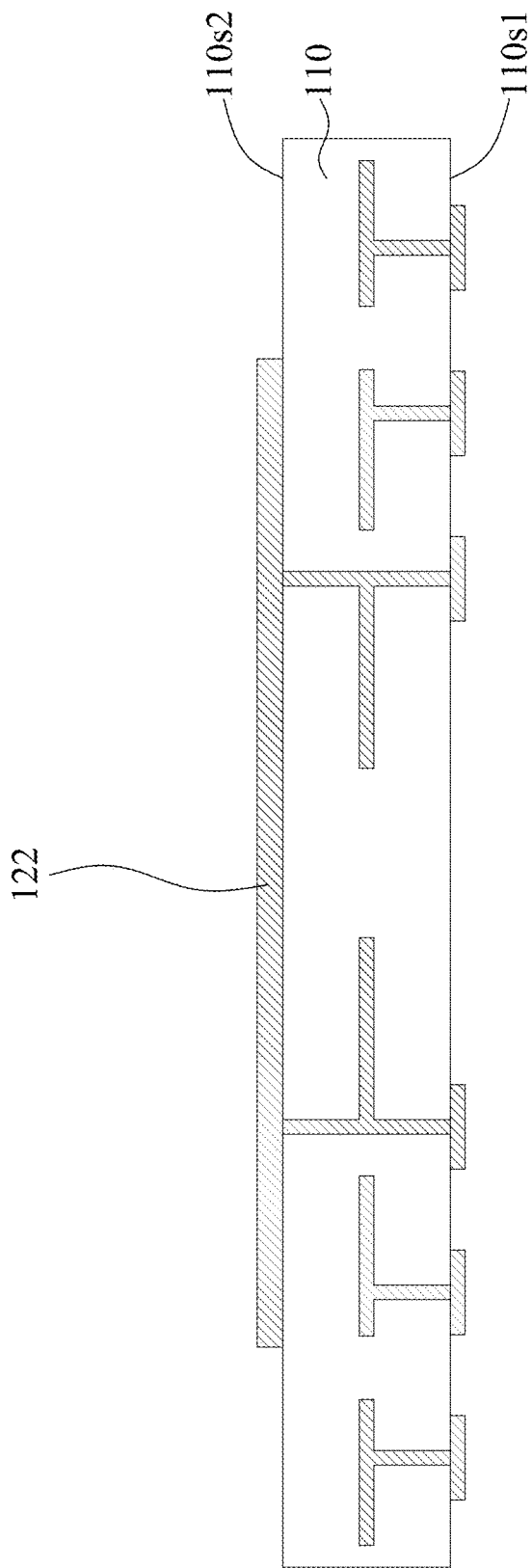
FIG. 5D is a cross-sectional view along line C-C' of the stage as shown in FIG. 5A, in accordance with some embodiments of the present disclosure.
Figure 6A:
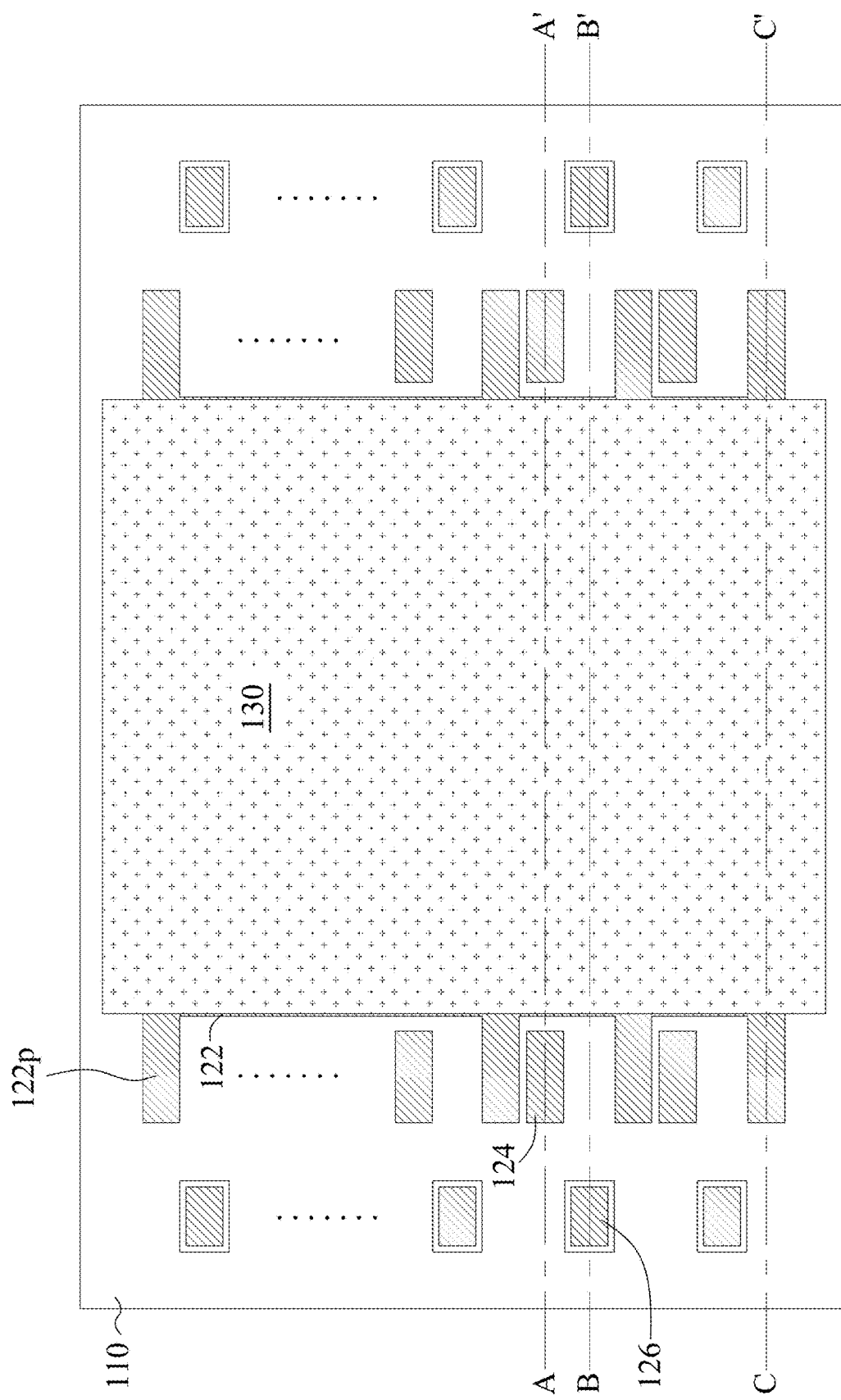
FIG. 6A illustrates one or more stages of an exemplary method for manufacturing a semiconductor device according to some embodiments of the present disclosure.
Figure 6B:
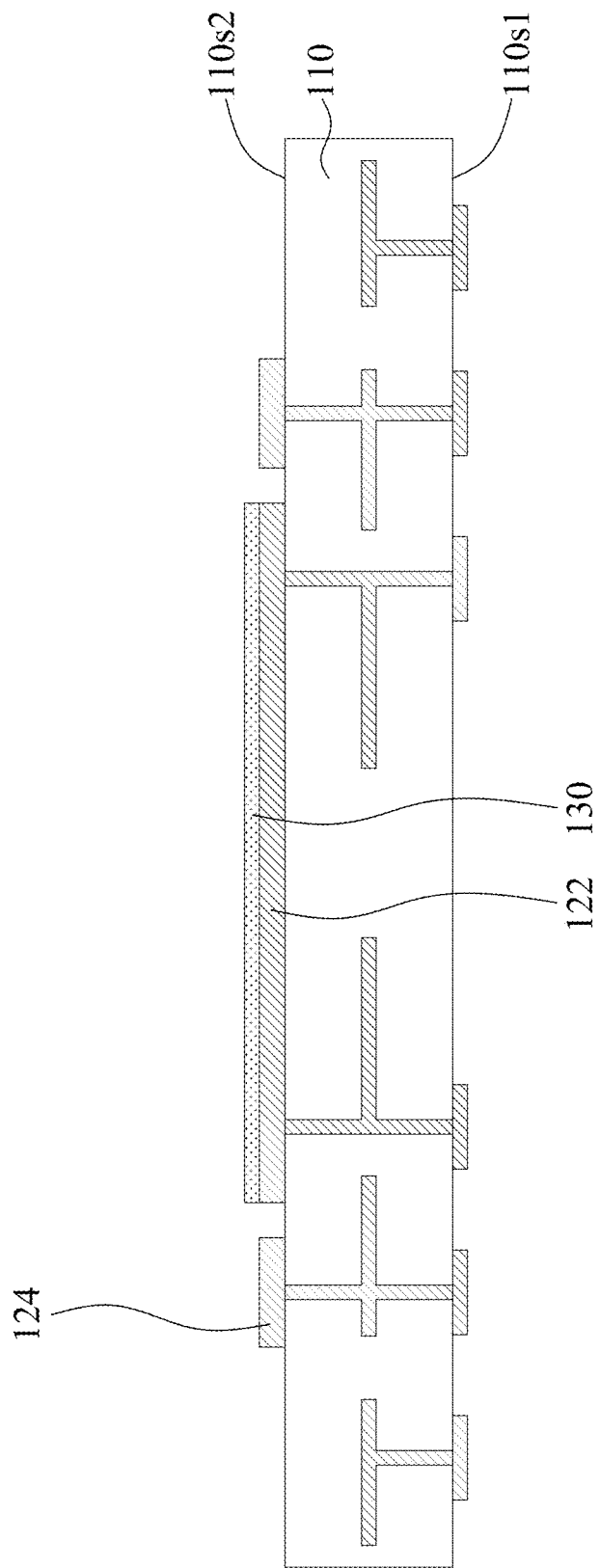
FIG. 6B is a cross-sectional view along line A-A' of the stage as shown in FIG. 6A, in accordance with some embodiments of the present disclosure.
Figure 6C:
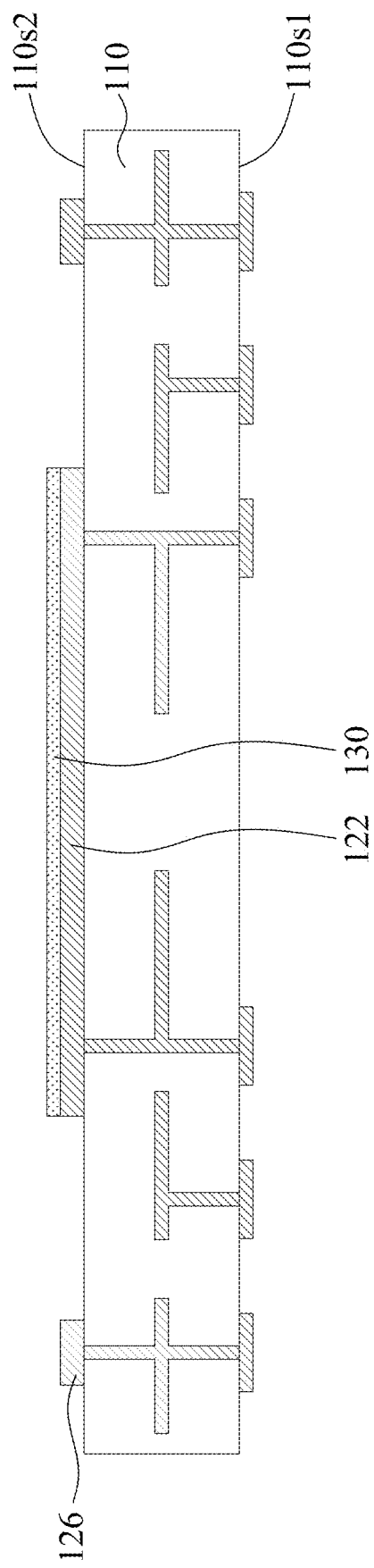
FIG. 6C is a cross-sectional view along line B-B' of the stage as shown in FIG. 6A, in accordance with some embodiments of the present disclosure.
Figure 6D:
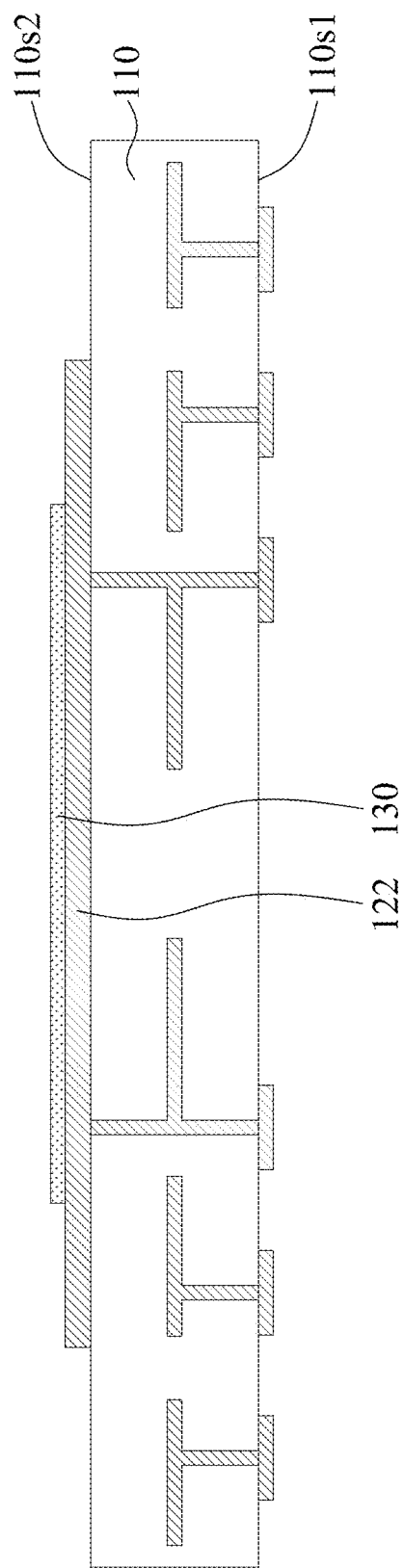
FIG. 6D is a cross-sectional view along line C-C' of the stage as shown in FIG. 6A, in accordance with some embodiments of the present disclosure.
Figure 7A:
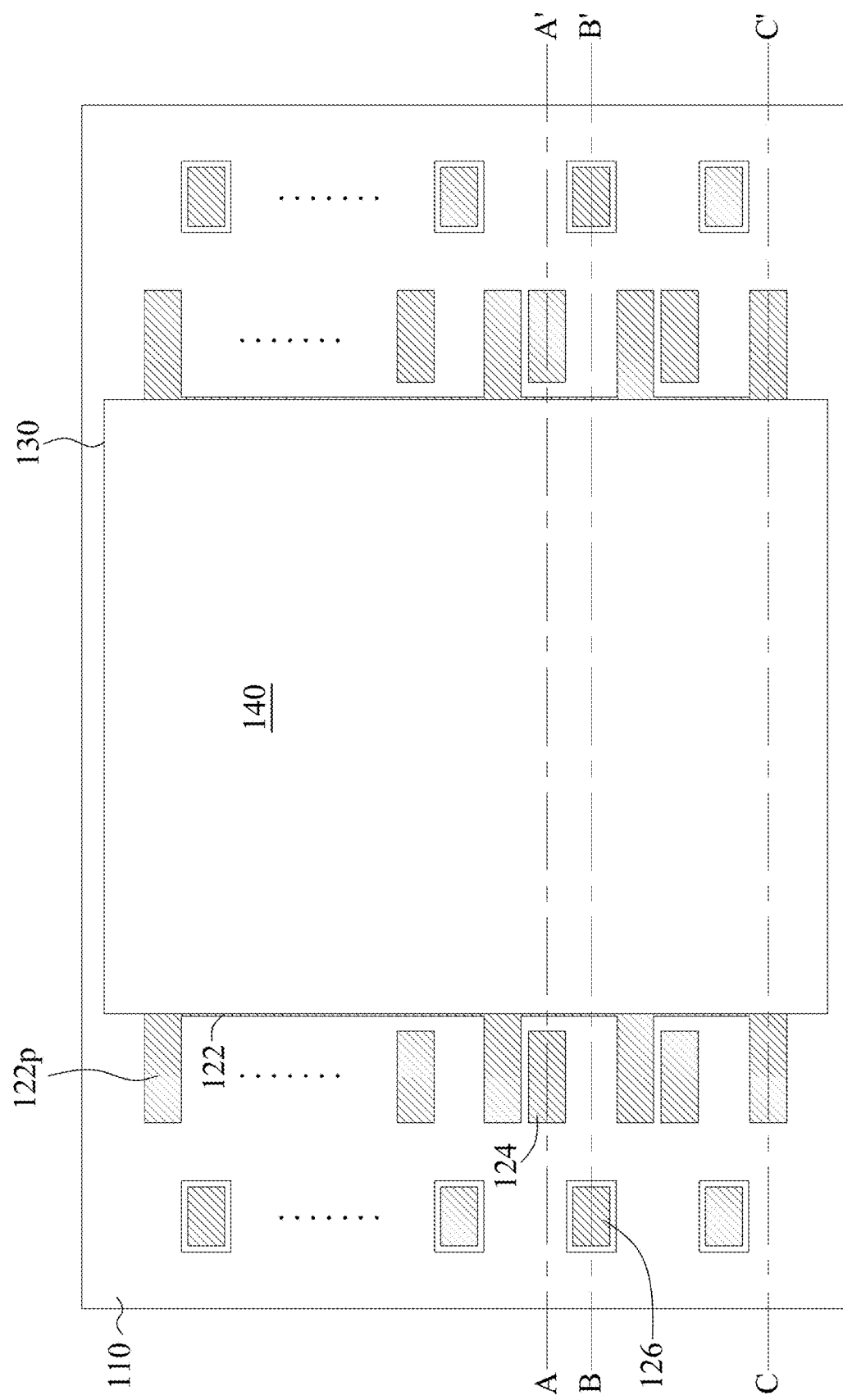
FIG. 7A illustrates one or more stages of an exemplary method for manufacturing a semiconductor device according to some embodiments of the present disclosure.
Figure 7B:
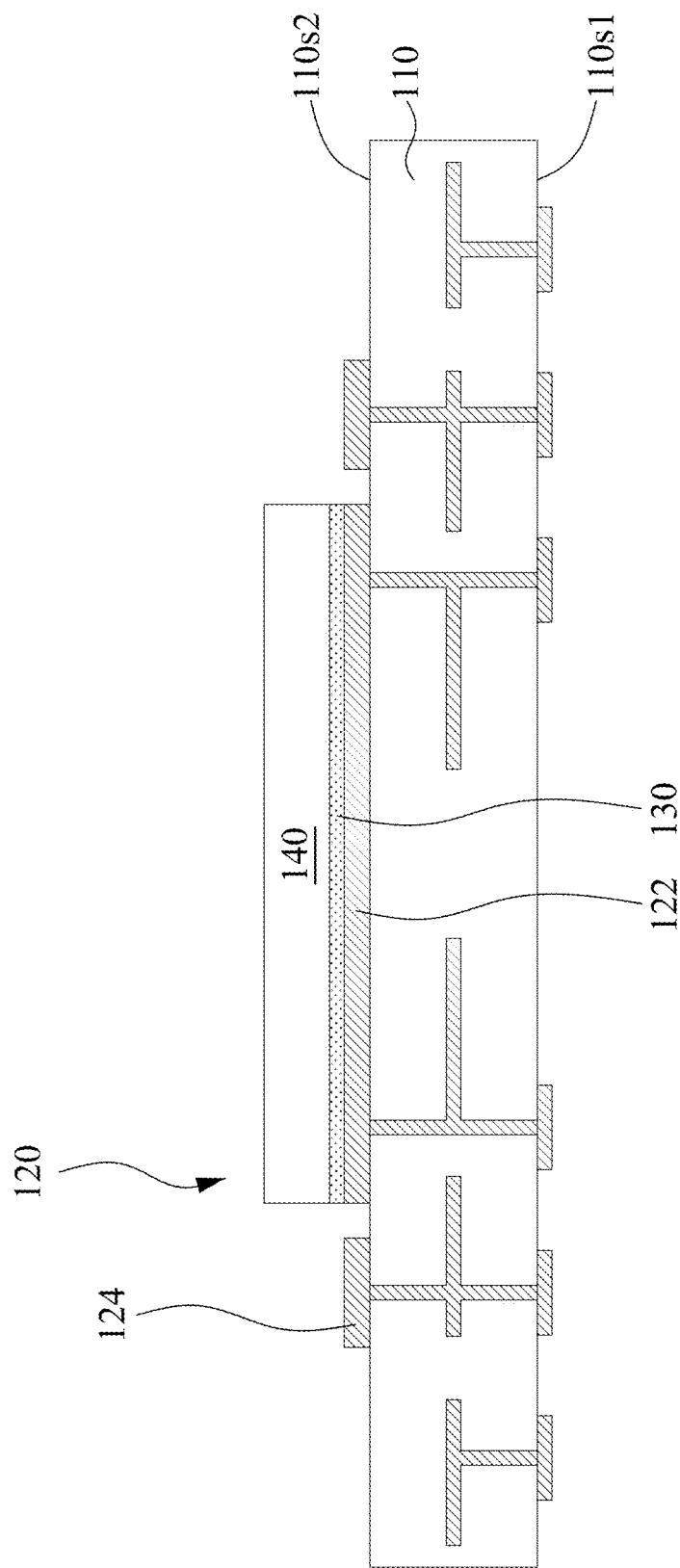
FIG. 7B is a cross-sectional view along line A-A' of the stage as shown in FIG. 7A, in accordance with some embodiments of the present disclosure.
Figure 7C:
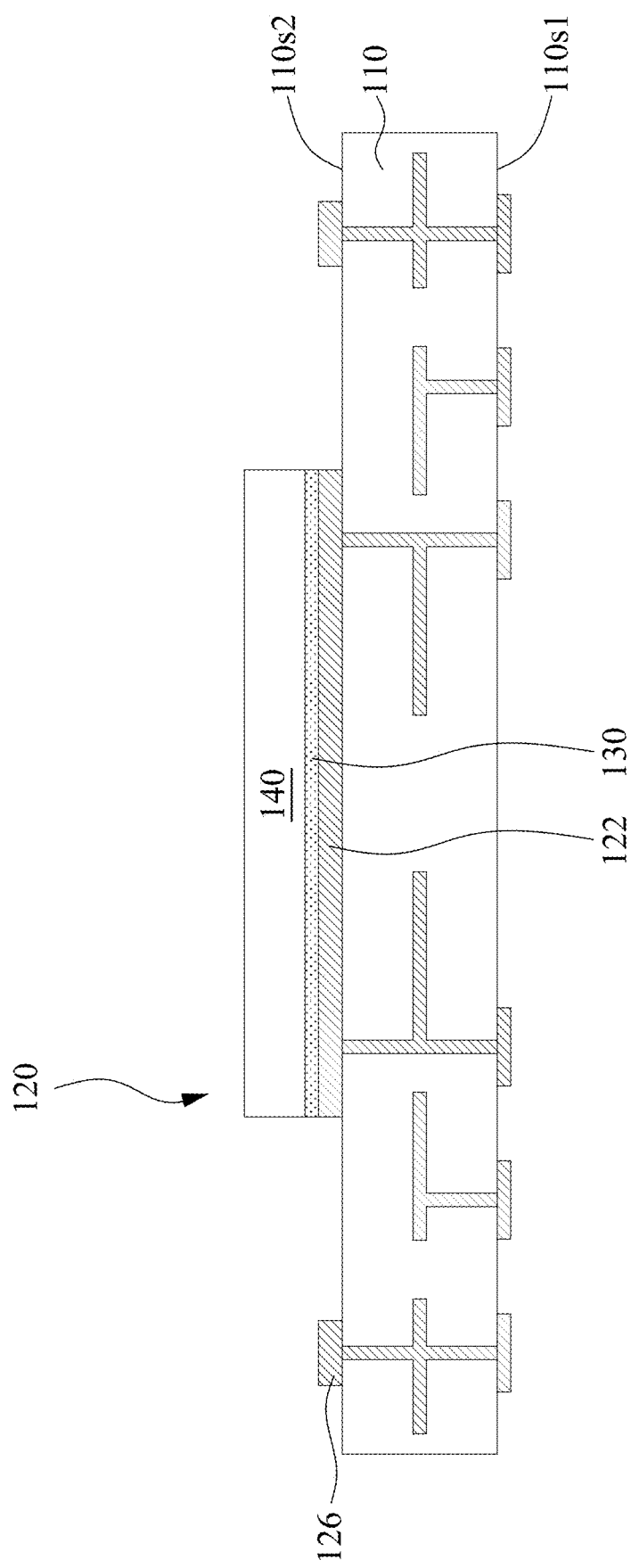
FIG. 7C is a cross-sectional view along line B-B' of the stage as shown in FIG. 7A, in accordance with some embodiments of the present disclosure.
Figure 7D:
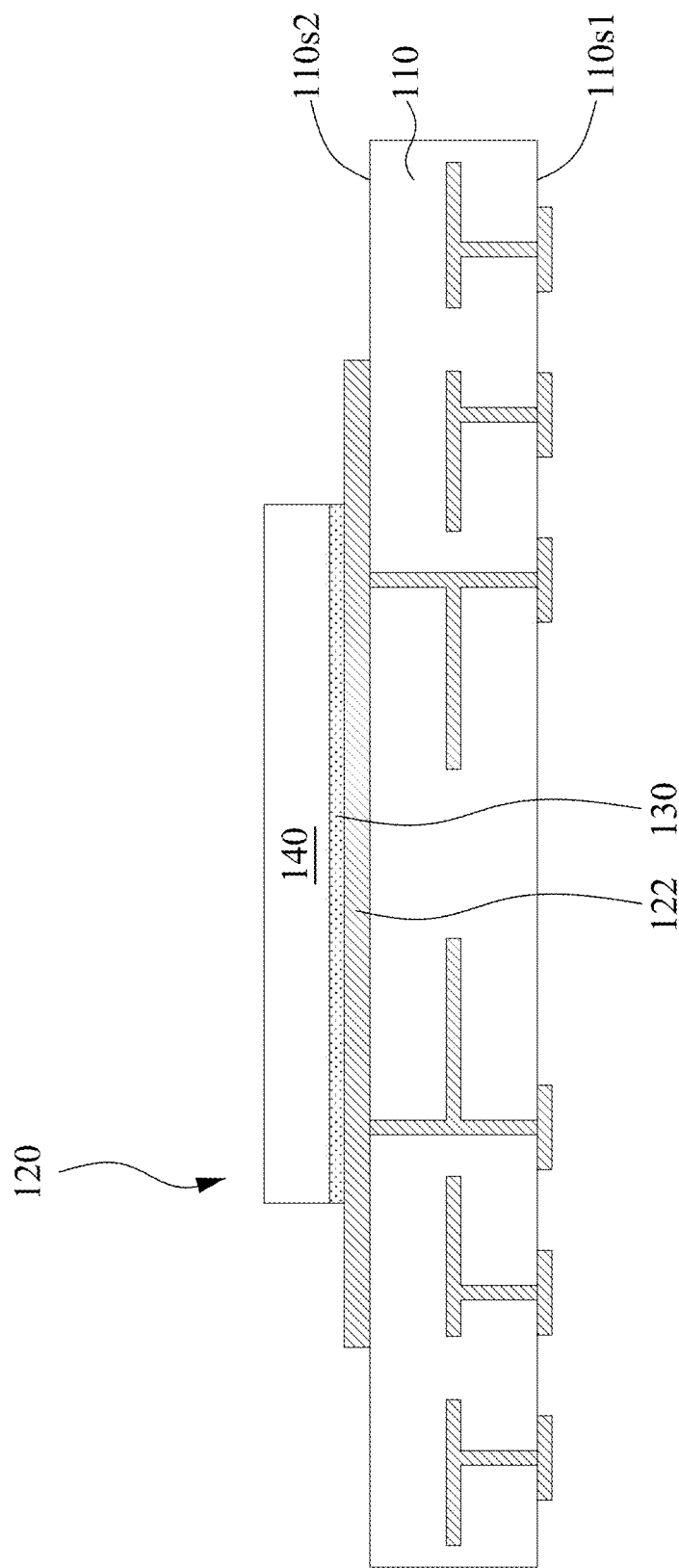
FIG. 7D is a cross-sectional view along line C-C' of the stage as shown in FIG. 7A, in accordance with some embodiments of the present disclosure.
Figure 8A:
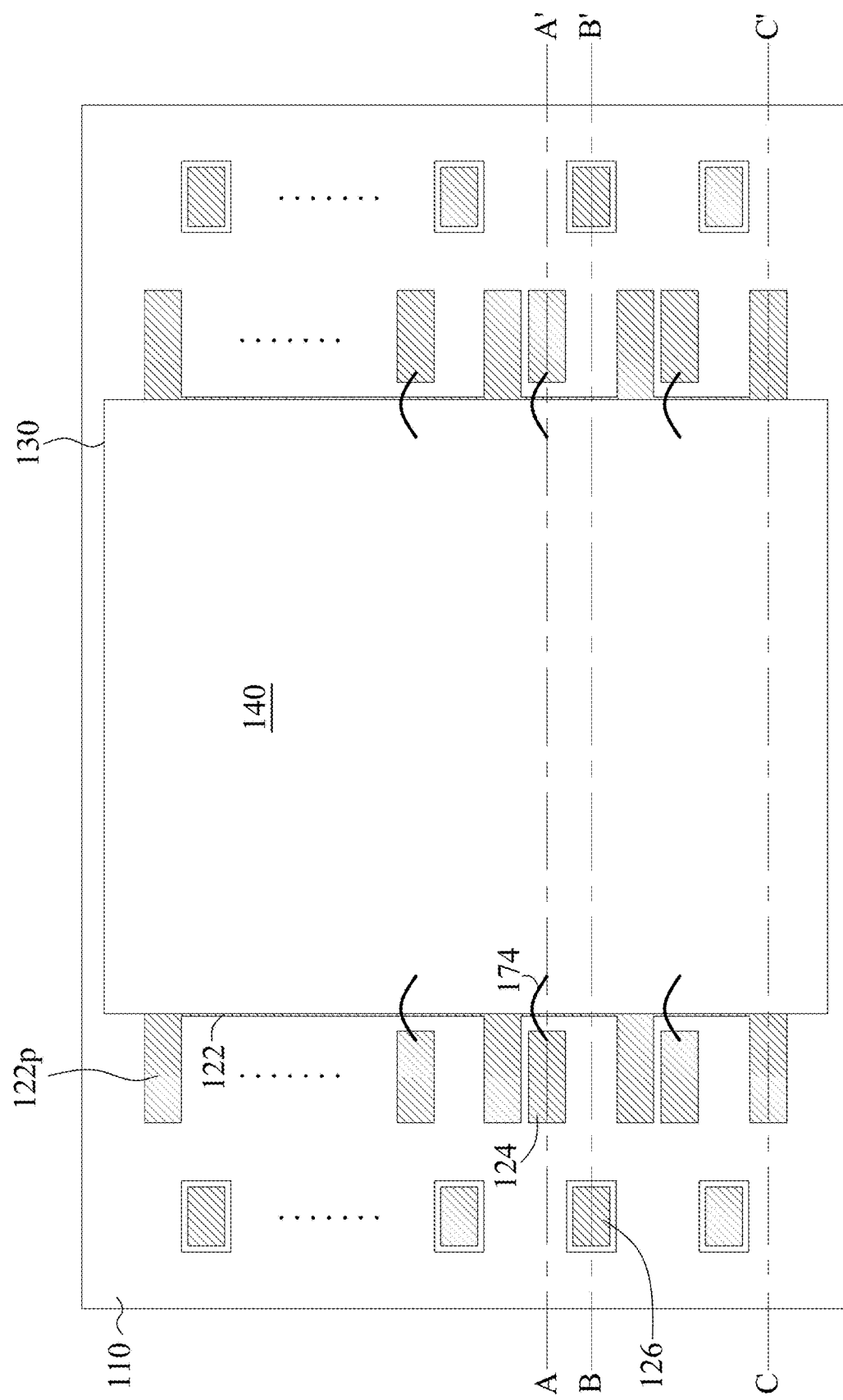
FIG. 8A illustrates one or more stages of an exemplary method for manufacturing a semiconductor device according to some embodiments of the present disclosure.
Figure 8B:
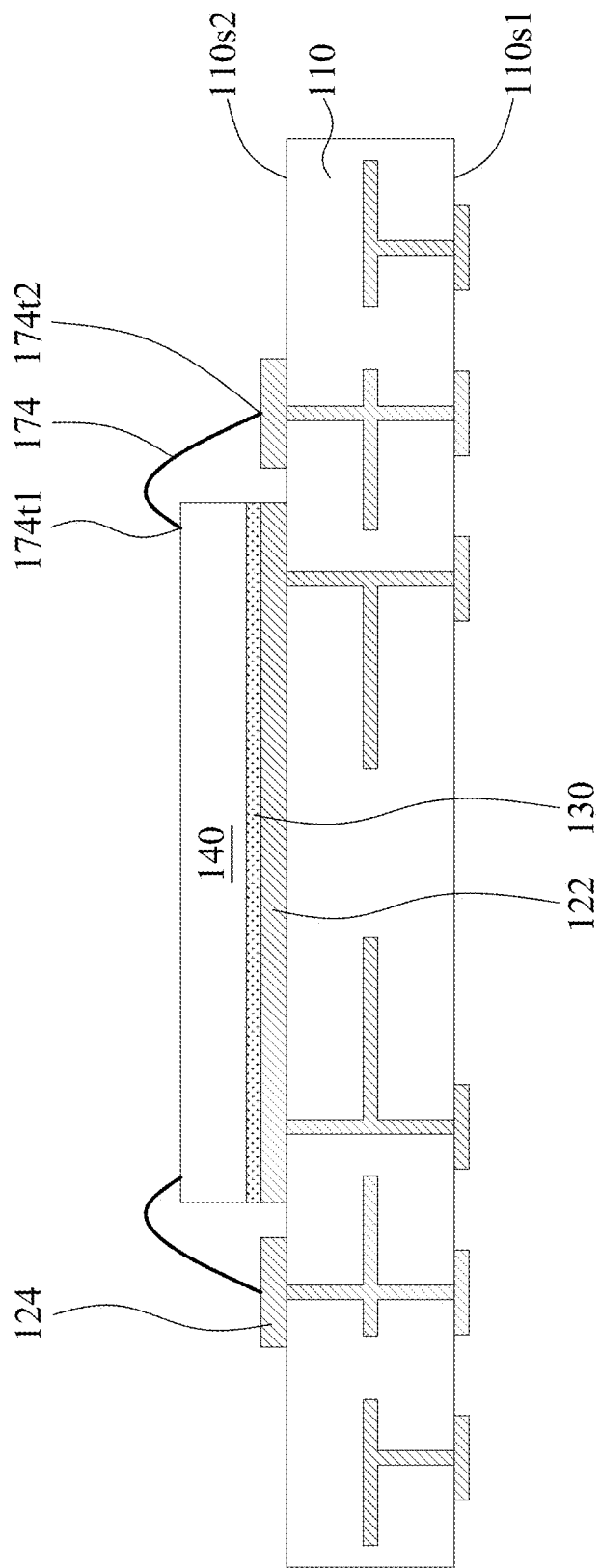
FIG. 8B is a cross-sectional view along line A-A' of the stage as shown in FIG. 8A, in accordance with some embodiments of the present disclosure.
Figure 8C:
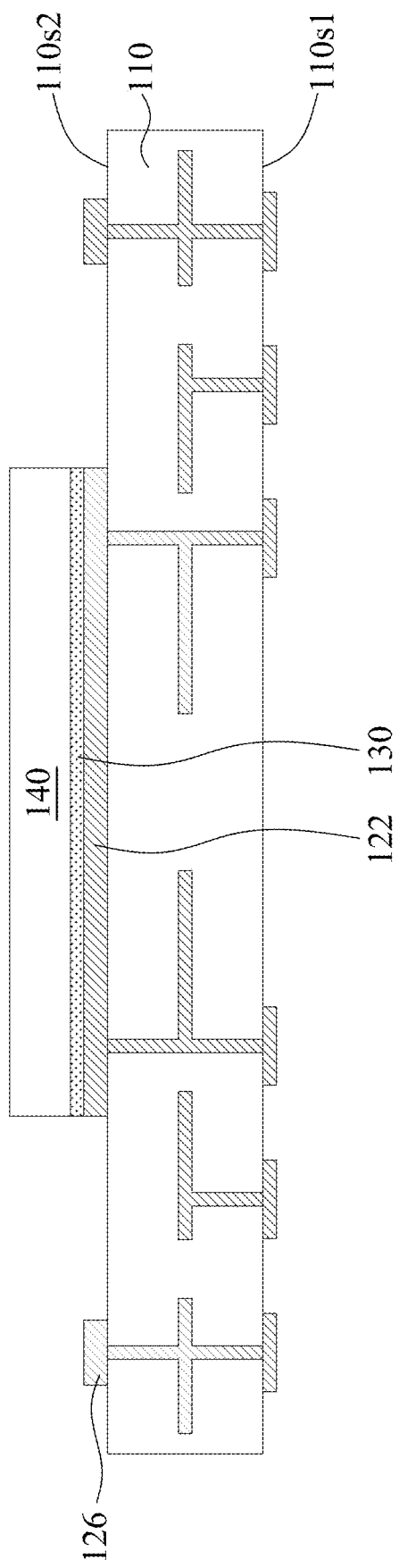
FIG. 8C is a cross-sectional view along line B-B' of the stage as shown in FIG. 8A, in accordance with some embodiments of the present disclosure.
Figure 8D:
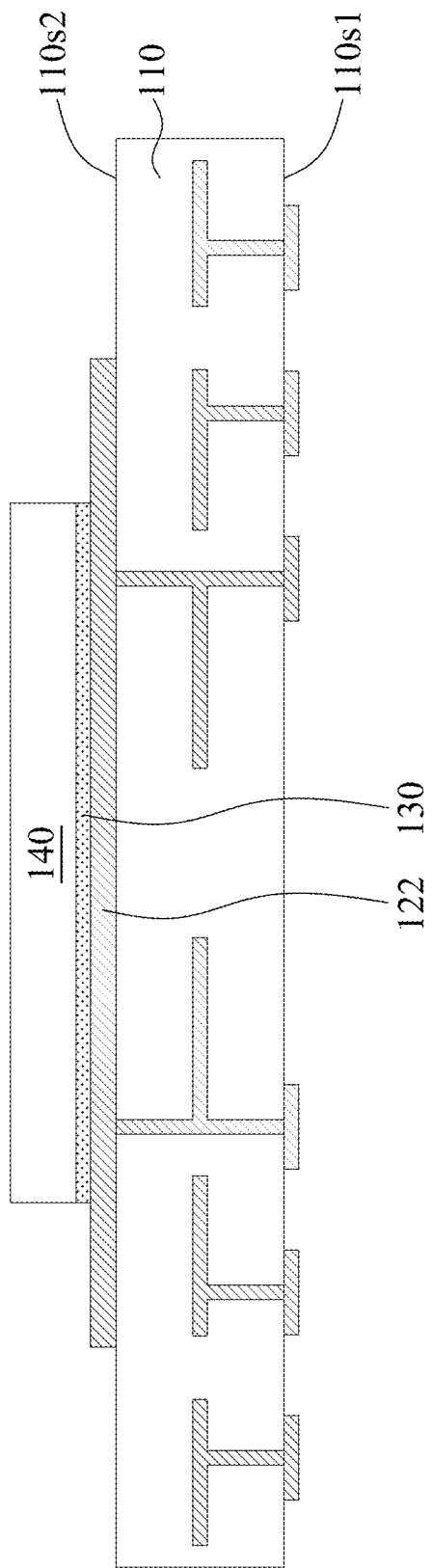
FIG. 8D is a cross-sectional view along line C-C' of the stage as shown in FIG. 8A, in accordance with some embodiments of the present disclosure.
Figure 9A:
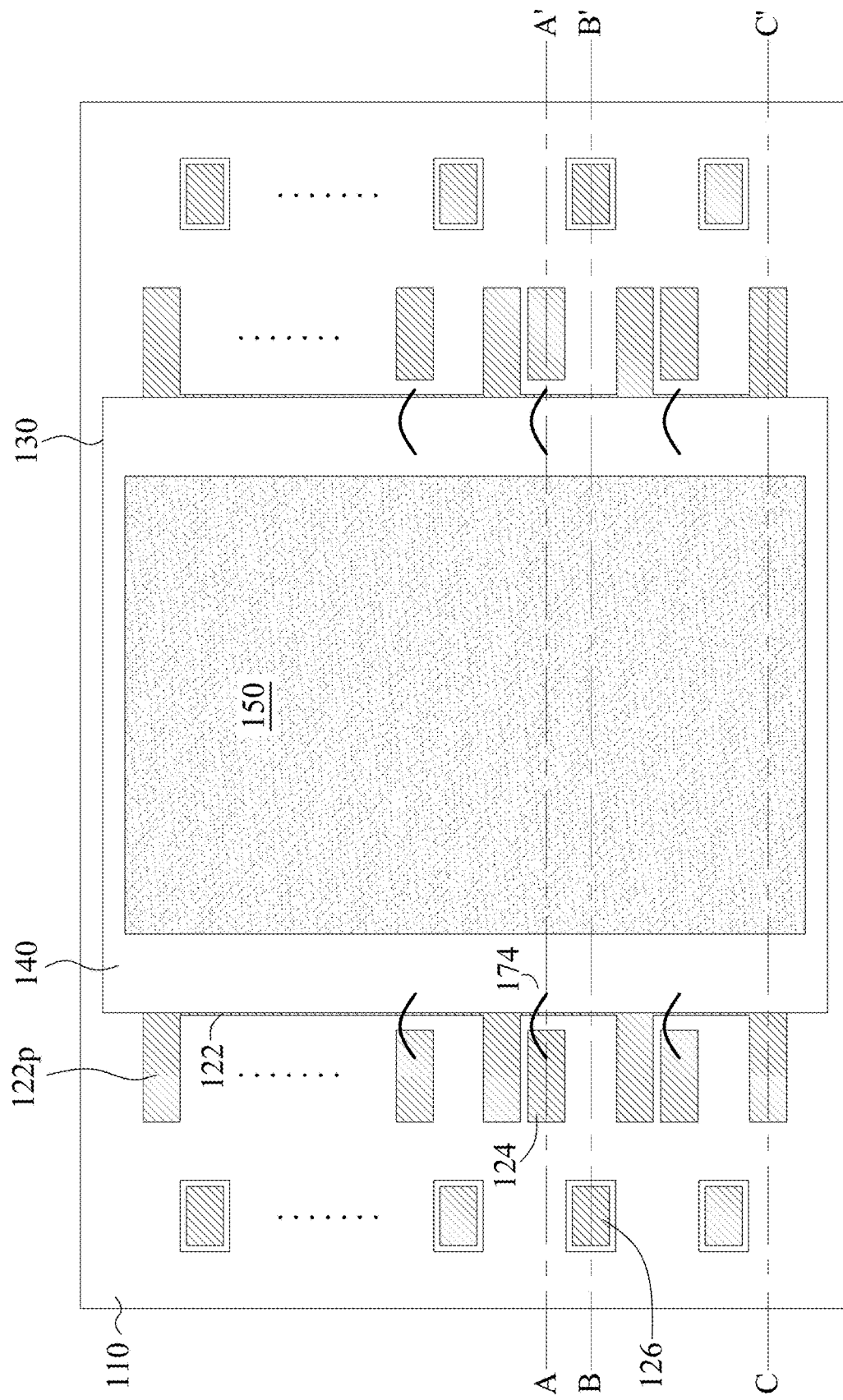
FIG. 9A illustrates one or more stages of an exemplary method for manufacturing a semiconductor device according to some embodiments of the present disclosure.
Figure 9B:
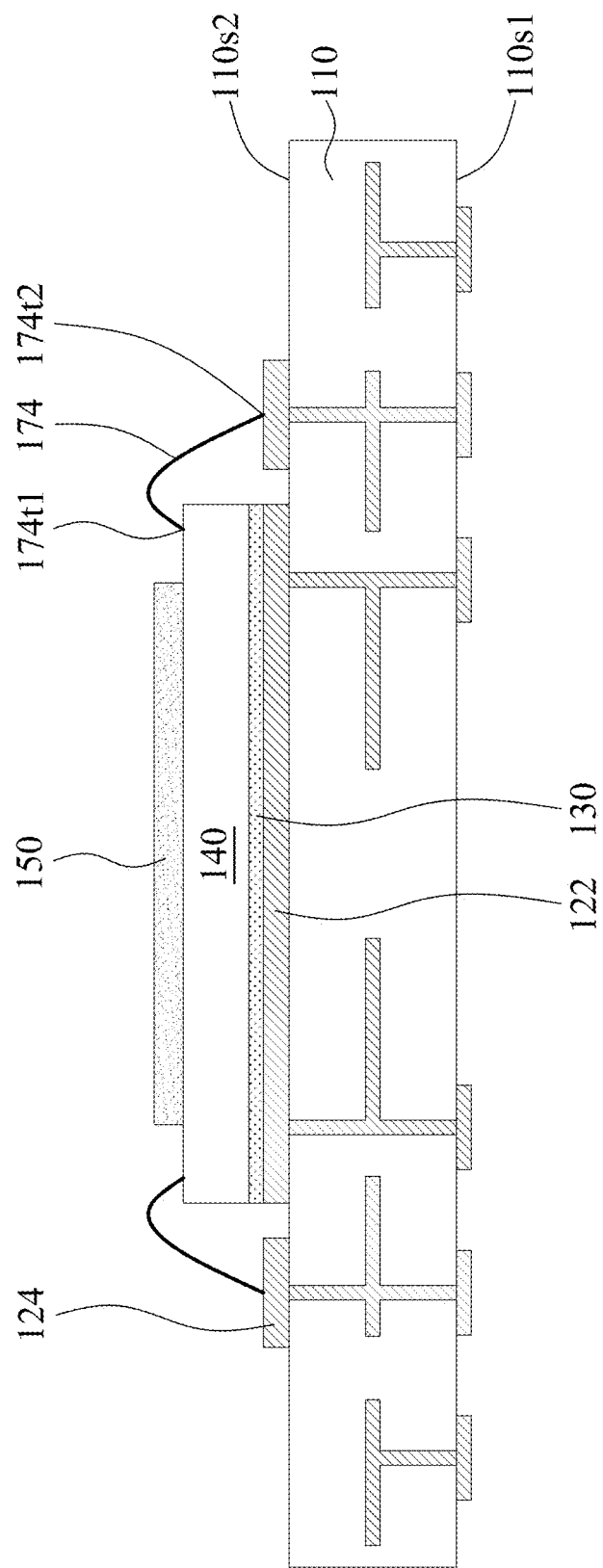
FIG. 9B is a cross-sectional view along line A-A' of the stage as shown in FIG. 9A, in accordance with some embodiments of the present disclosure.
Figure 9C:
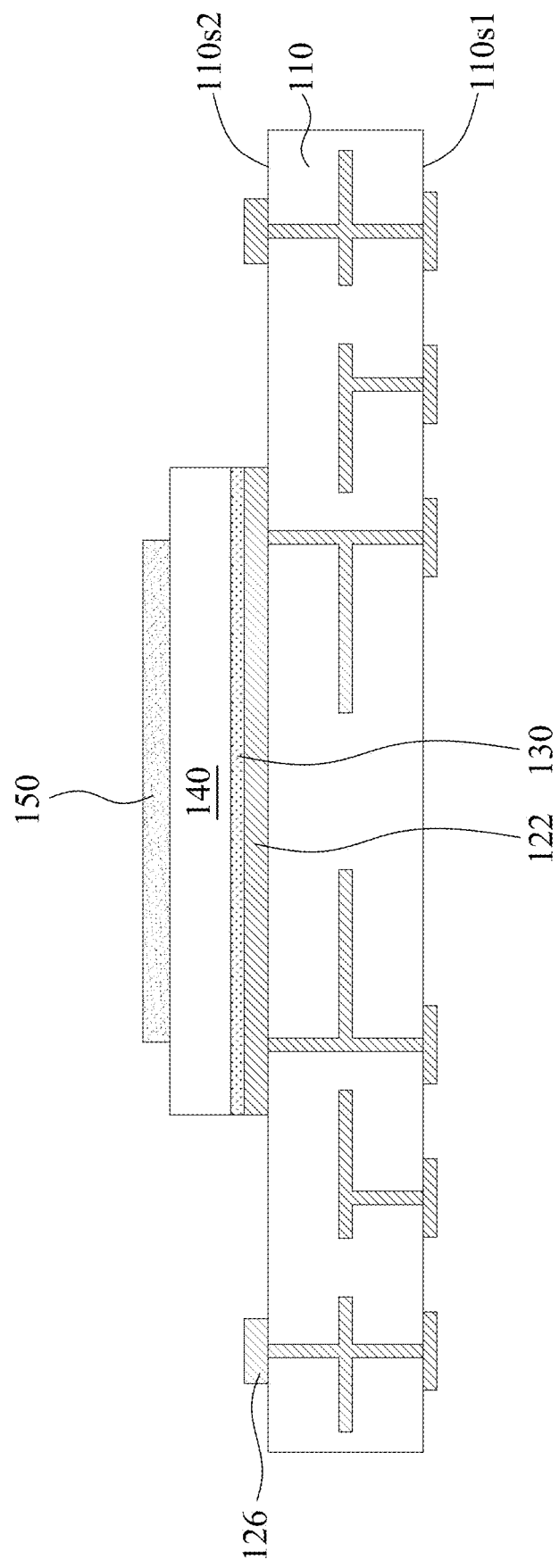
FIG. 9C is a cross-sectional view along line B-B' of the stage as shown in FIG. 9A, in accordance with some embodiments of the present disclosure.
Figure 9D:
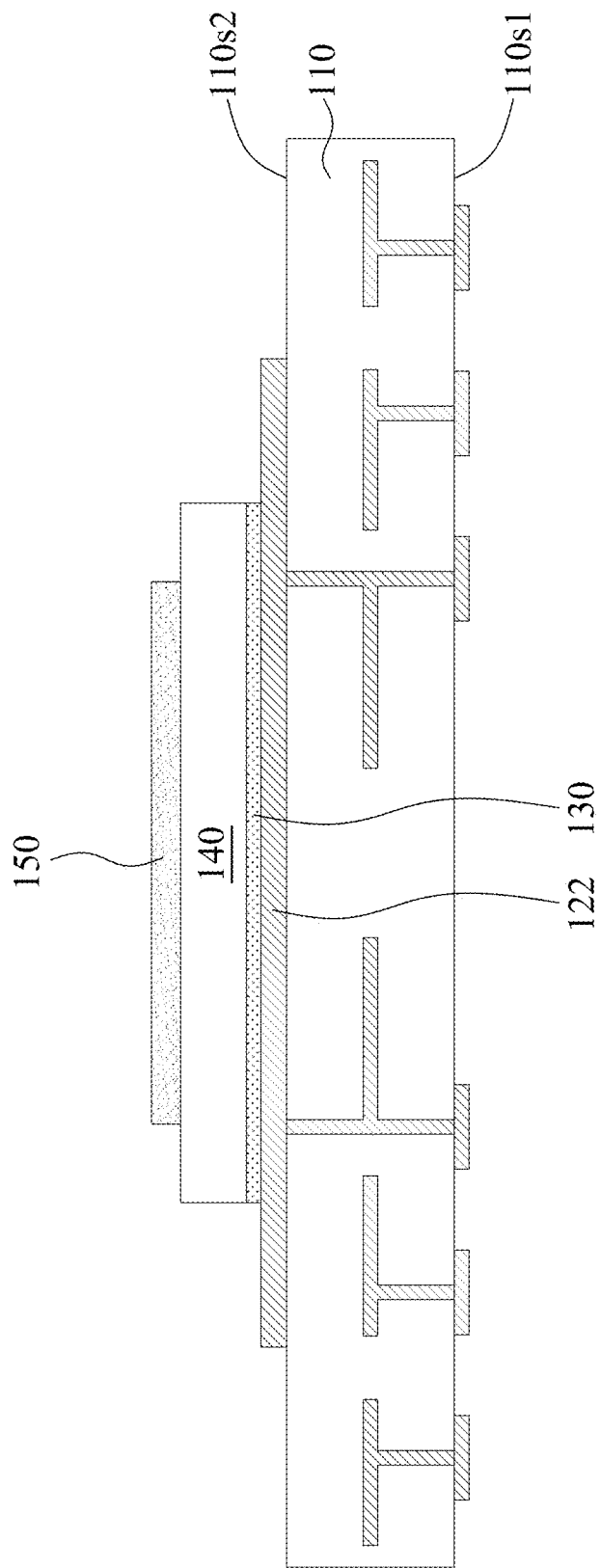
FIG. 9D is a cross-sectional view along line C-C' of the stage as shown in FIG. 9A, in accordance with some embodiments of the present disclosure.
Figure 10A:
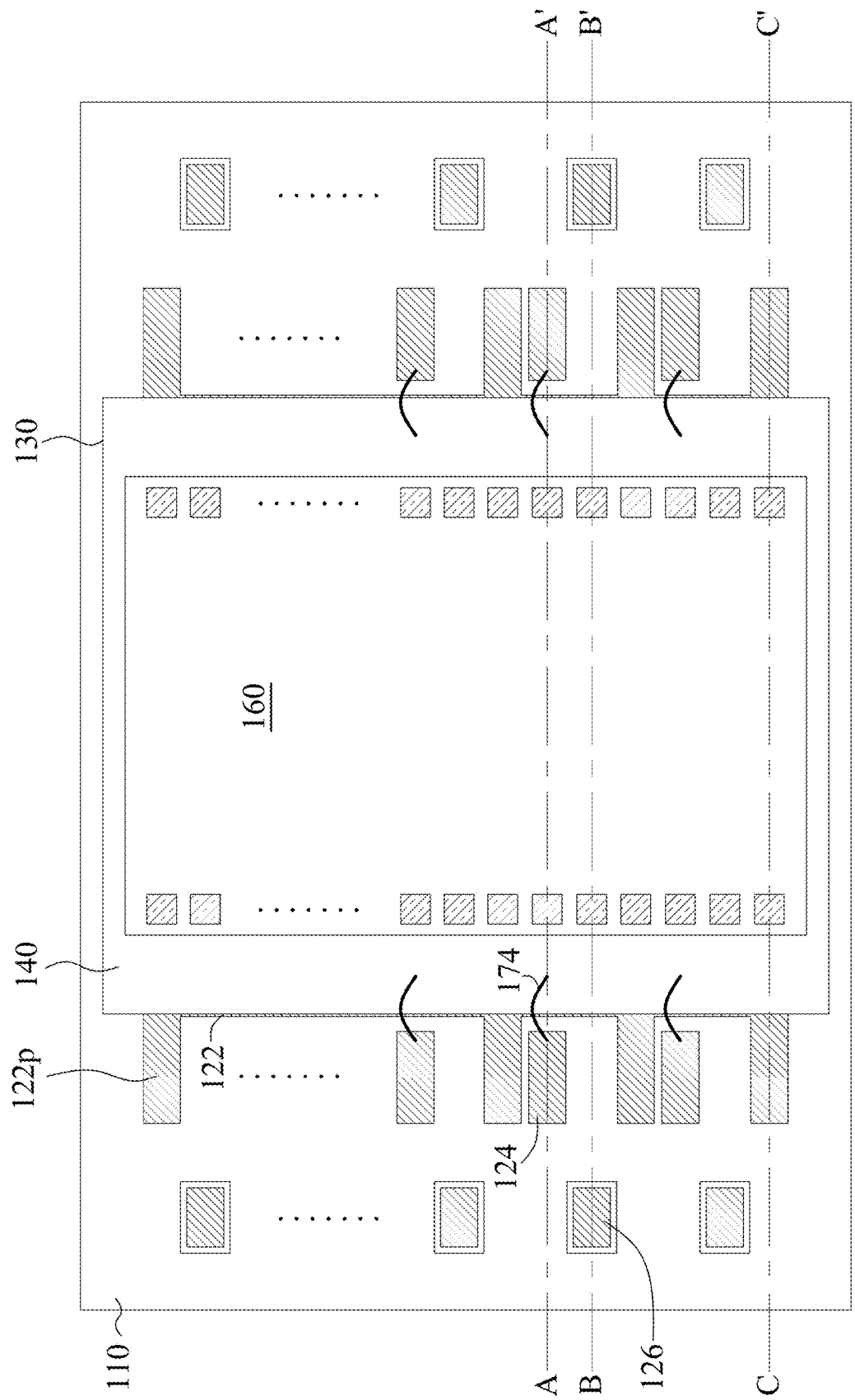
FIG. 10A illustrates one or more stages of an exemplary method for manufacturing a semiconductor device according to some embodiments of the present disclosure.
Figure 10B:
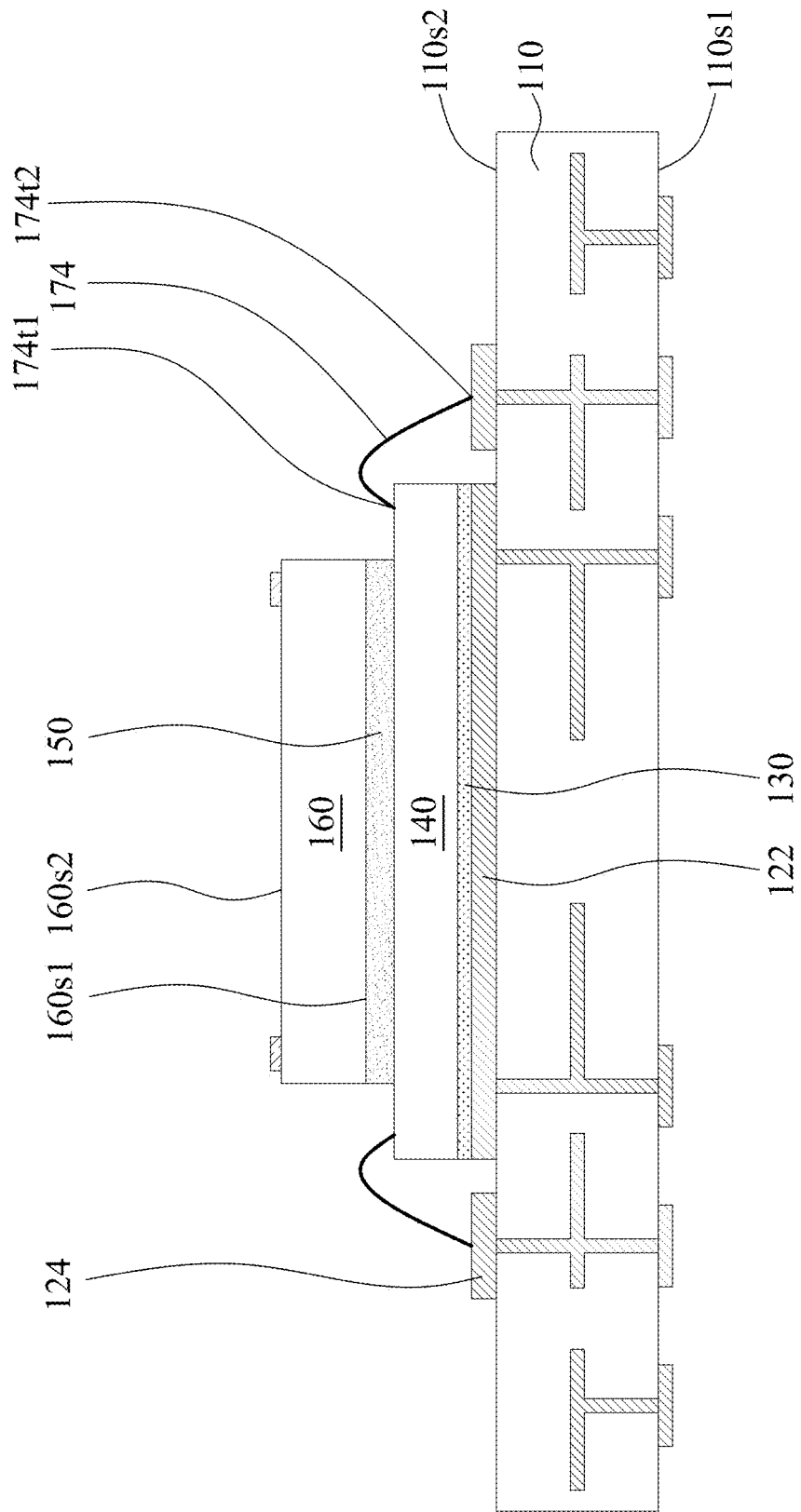
FIG. 10B is a cross-sectional view along line A-A' of the stage as shown in FIG. 10A, in accordance with some embodiments of the present disclosure.
Figure 10C:
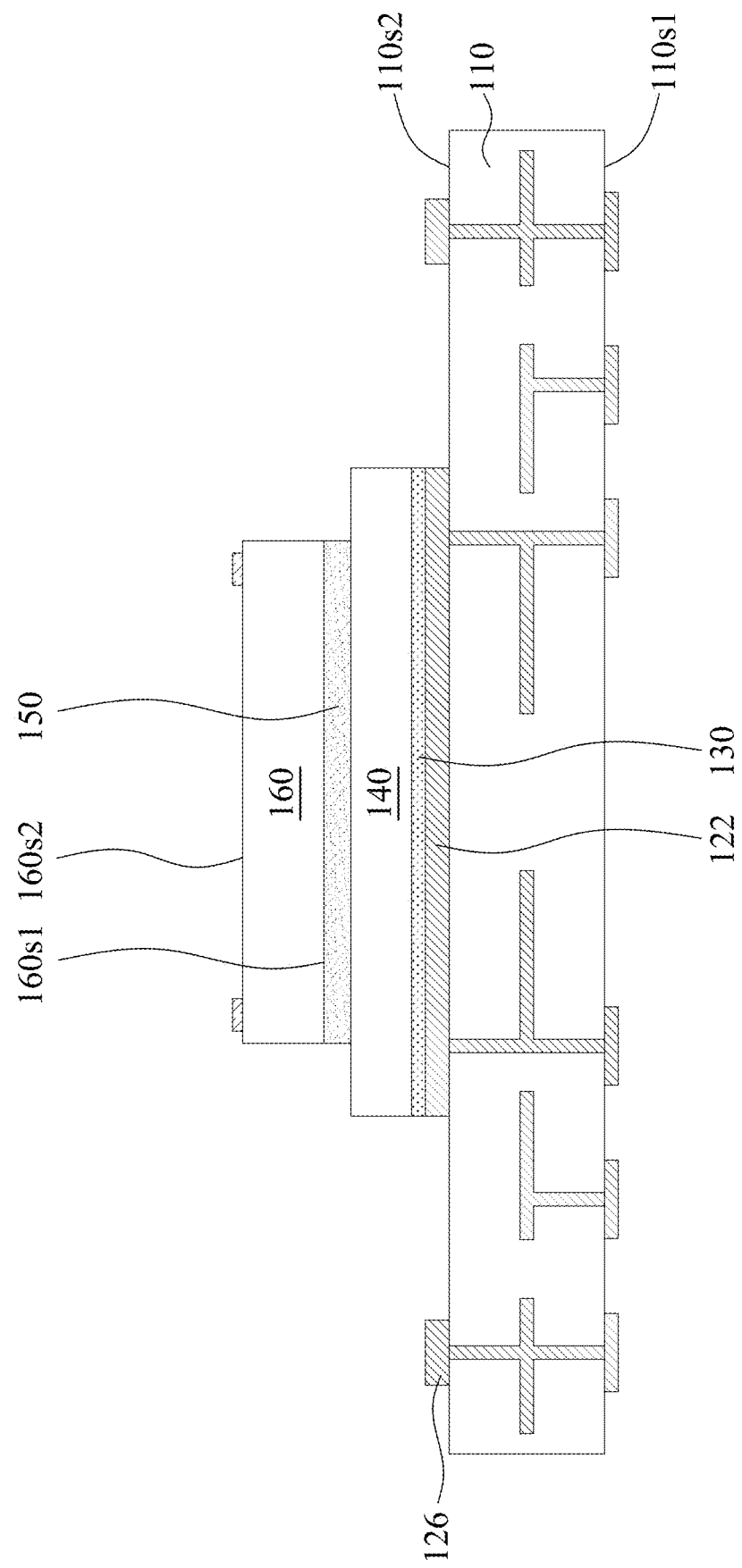
FIG. 10C is a cross-sectional view along line B-B' of the stage as shown in FIG. 10A, in accordance with some embodiments of the present disclosure.
Figure 10D:
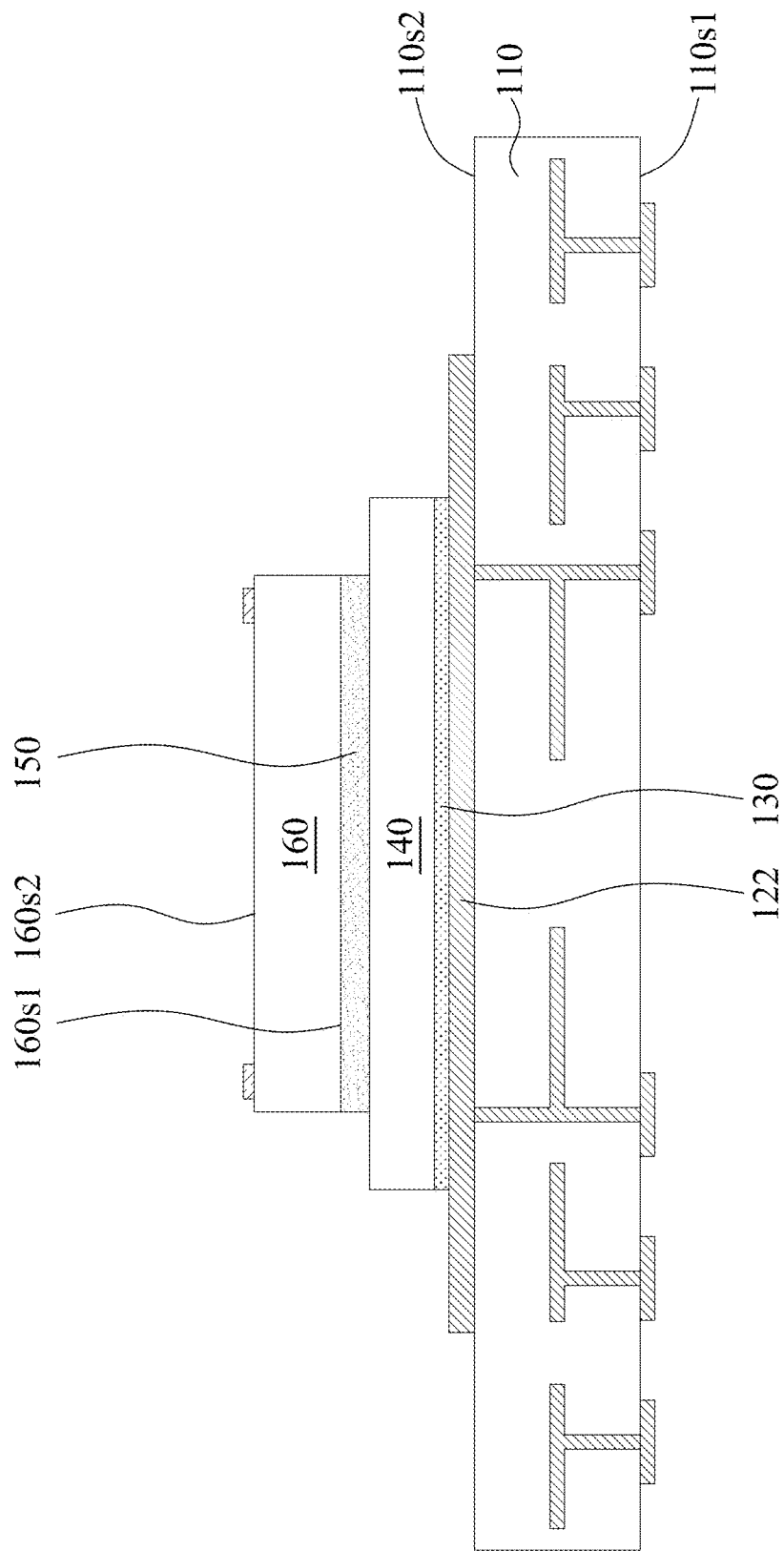
FIG. 10D is a cross-sectional view along line C-C' of the stage as shown in FIG. 10A, in accordance with some embodiments of the present disclosure.
Figure 11A:
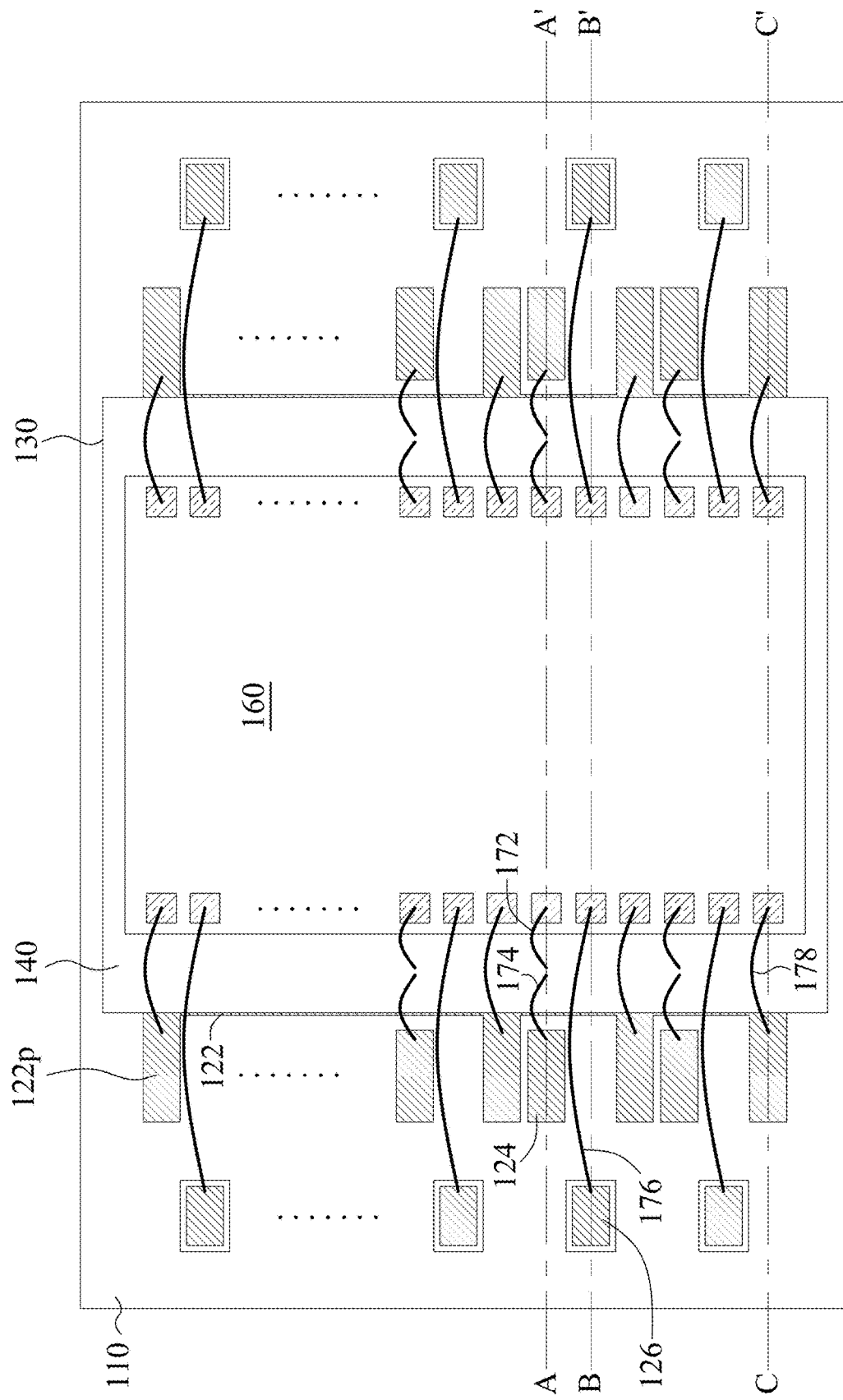
FIG. 11A illustrates one or more stages of an exemplary method for manufacturing a semiconductor device according to some embodiments of the present disclosure.
Figure 11B:
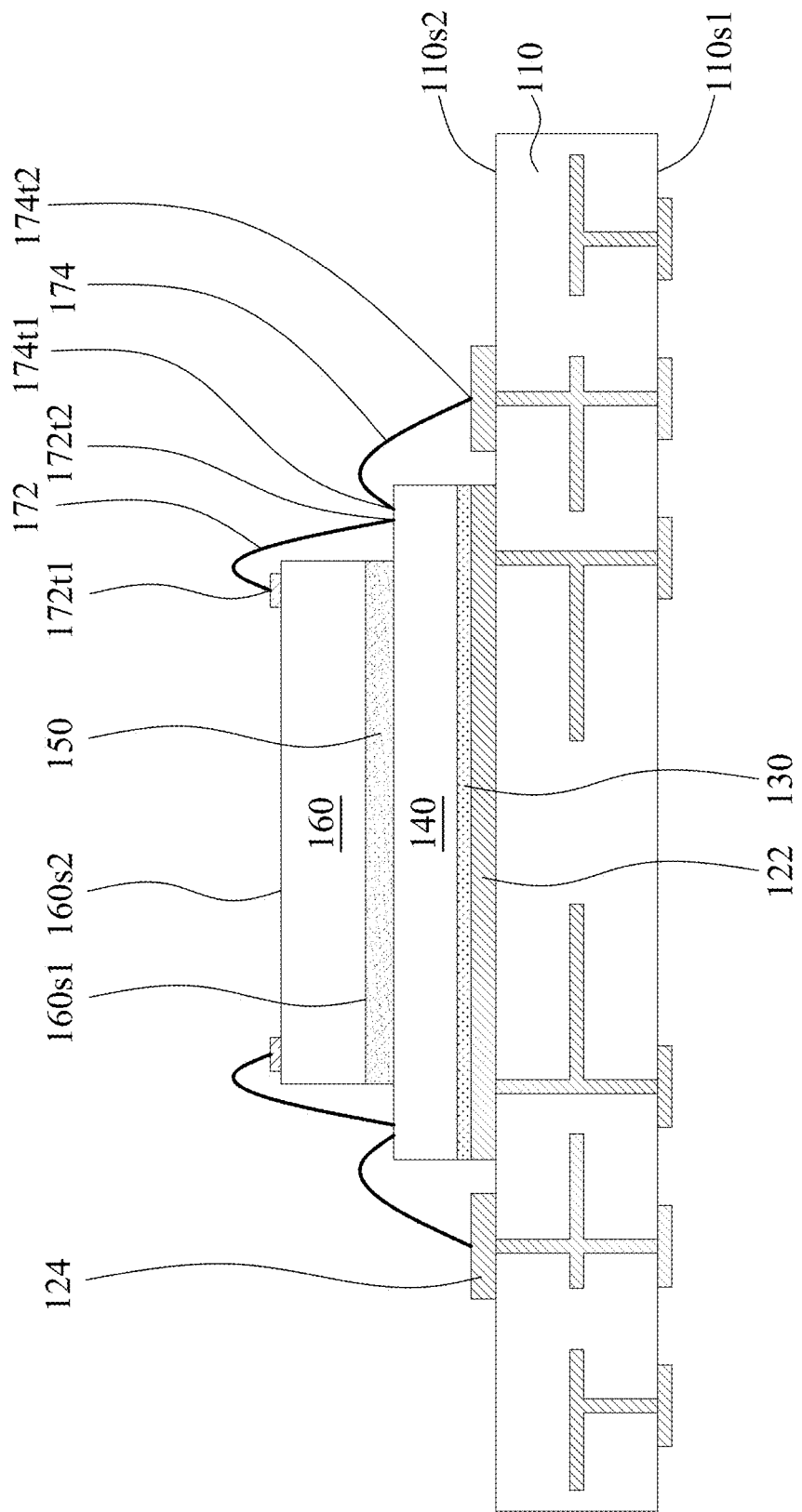
FIG. 11B is a cross-sectional view along line A-A' of the stage as shown in FIG. 11A, in accordance with some embodiments of the present disclosure.
Figure 11C:
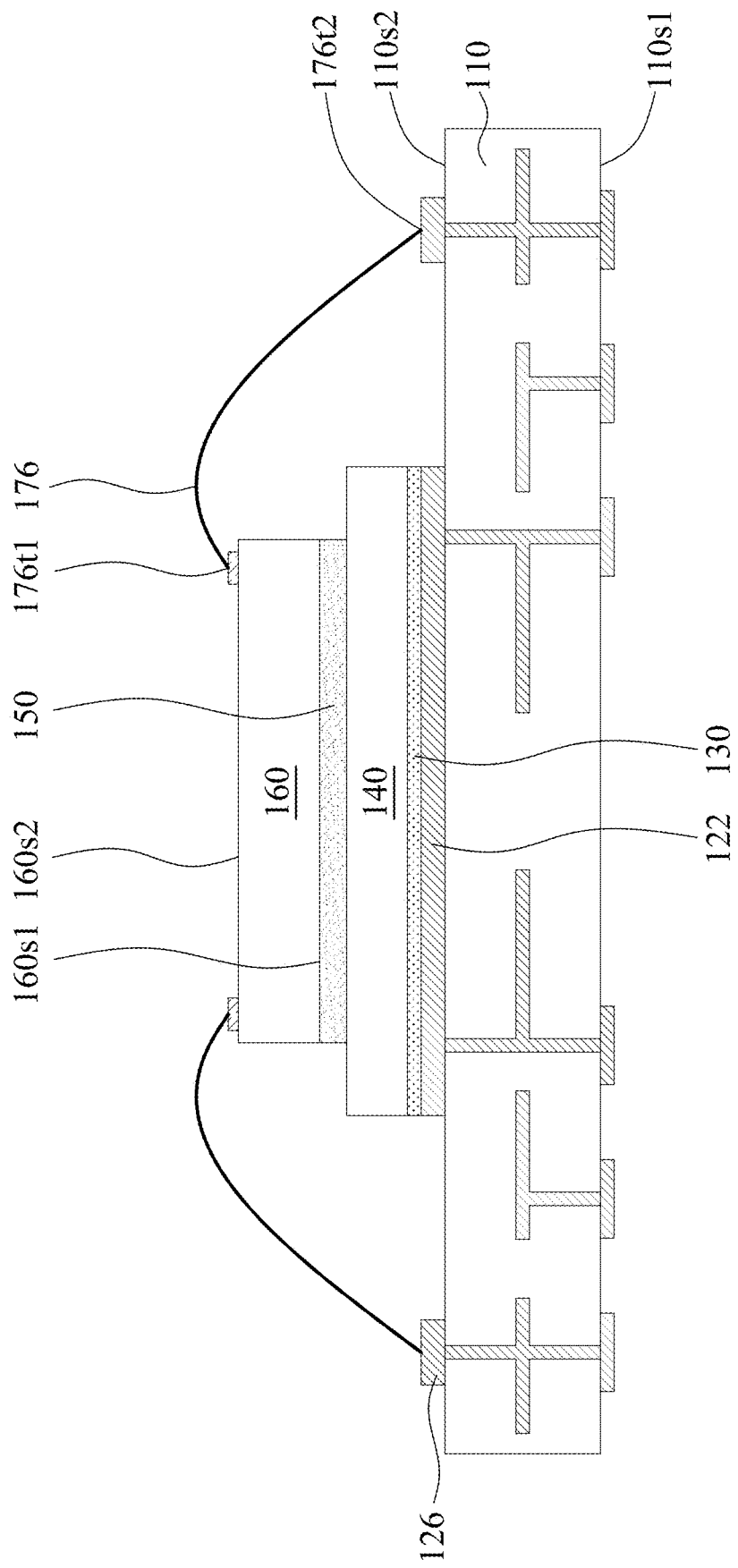
FIG. 11C is a cross-sectional view along line B-B' of the stage as shown in FIG. 11A, in accordance with some embodiments of the present disclosure.
Figure 11D:
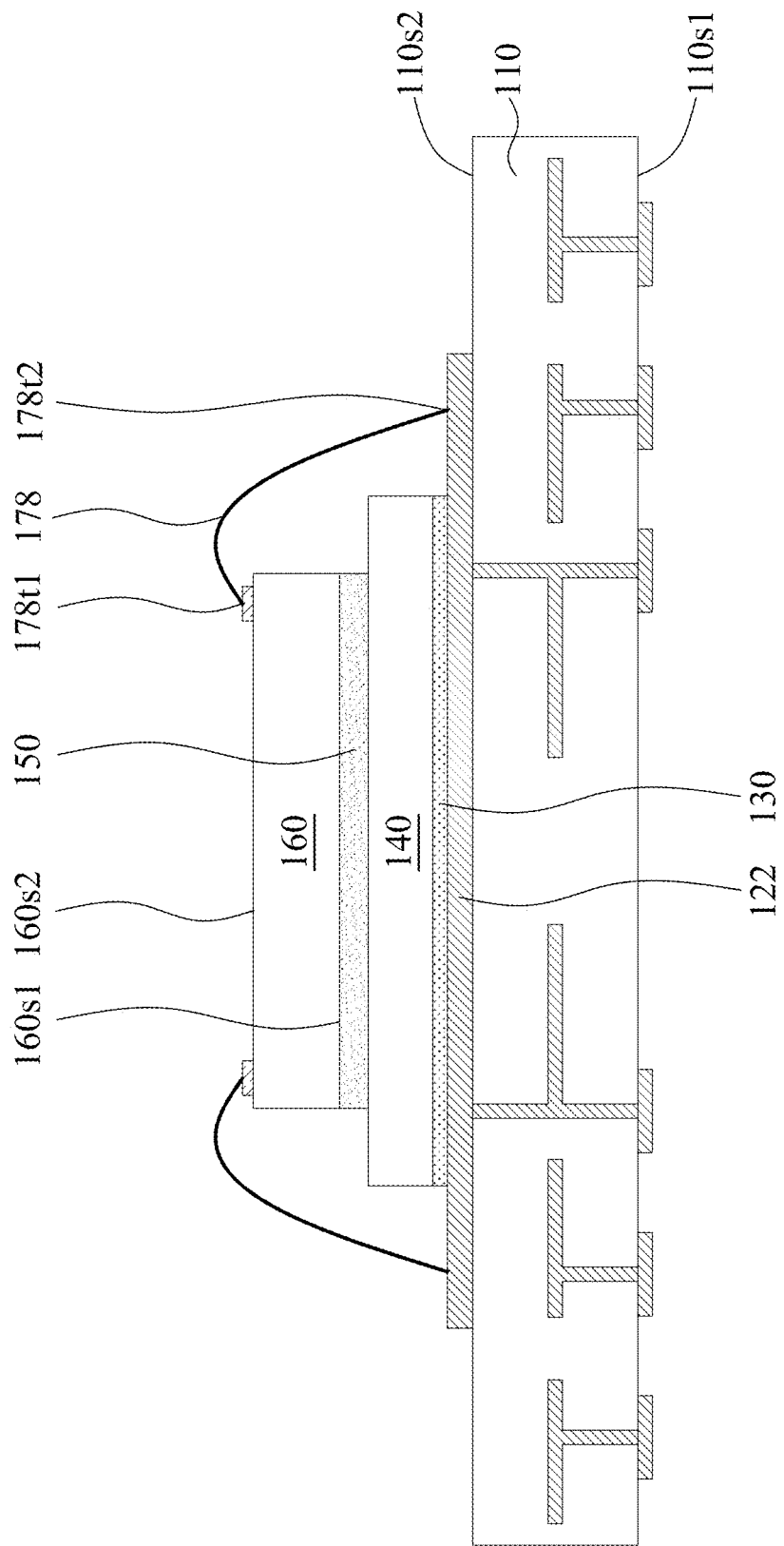
FIG. 11D is a cross-sectional view along line C-C' of the stage as shown in FIG. 11A, in accordance with some embodiments of the present disclosure.
Figure 12A:
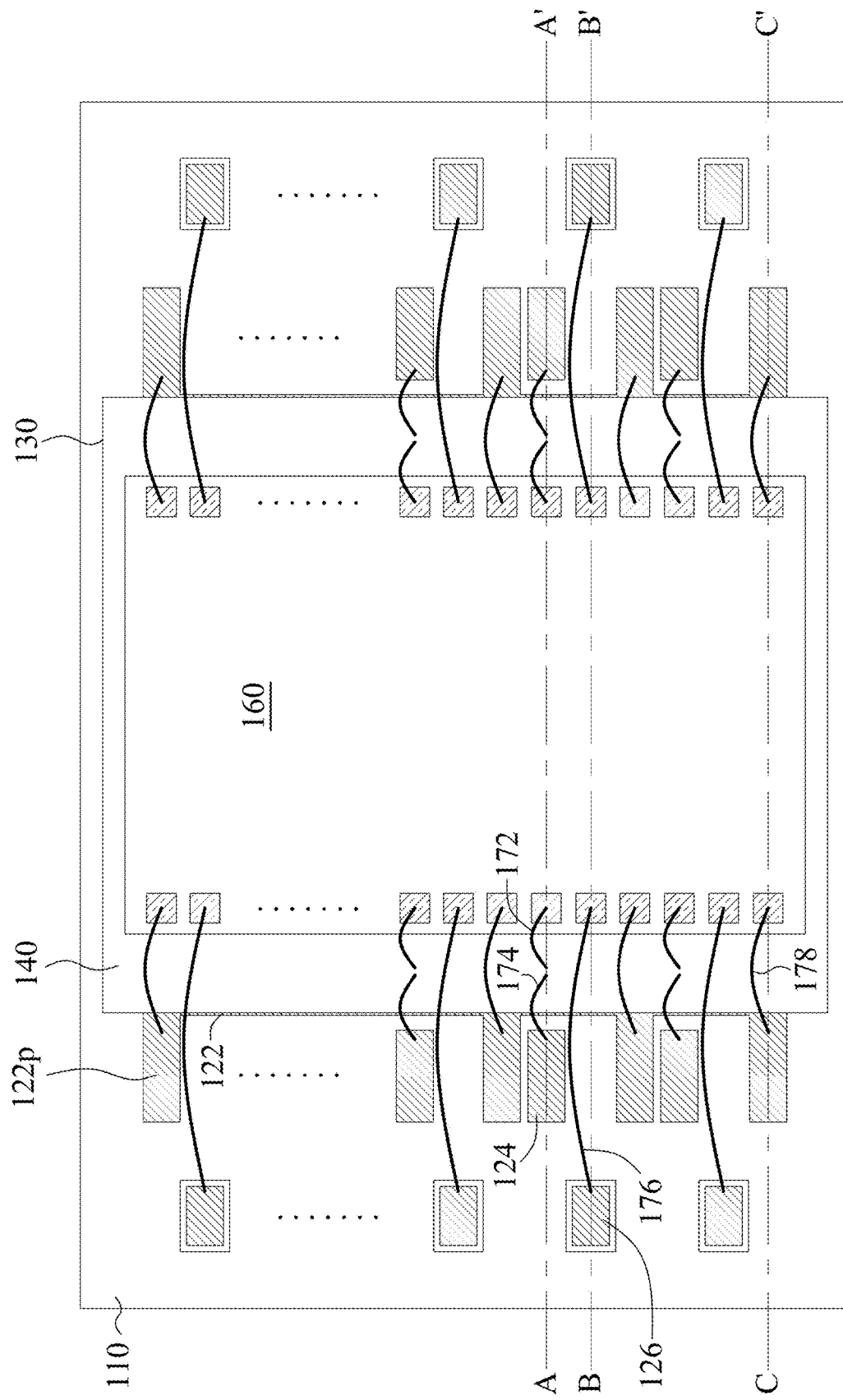
FIG. 12A illustrates one or more stages of an exemplary method for manufacturing a semiconductor device according to some embodiments of the present disclosure.
Figure 12B:
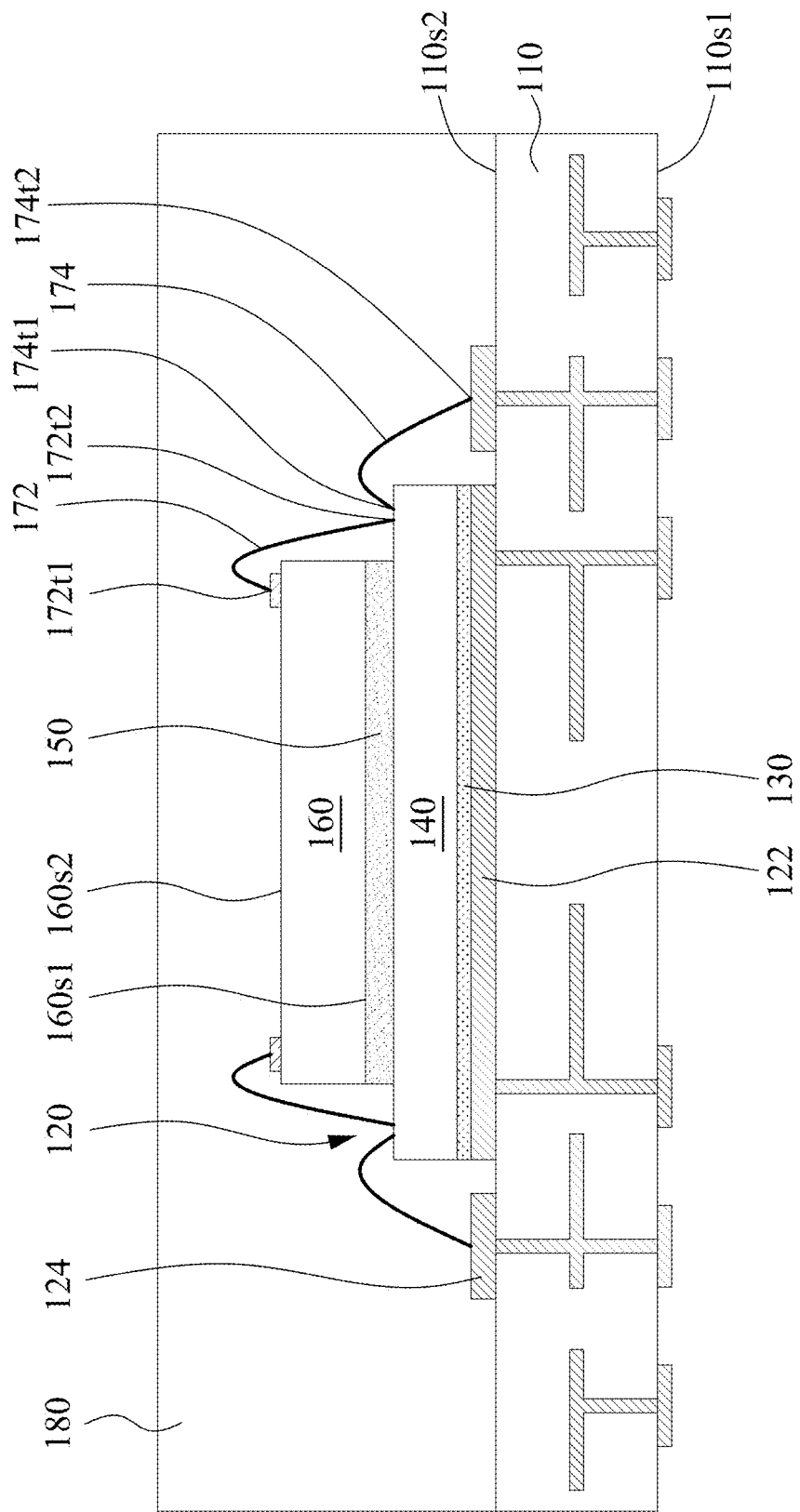
FIG. 12B is a cross-sectional view along line A-A' of the stage as shown in FIG. 12A, in accordance with some embodiments of the present disclosure.
Figure 12C:
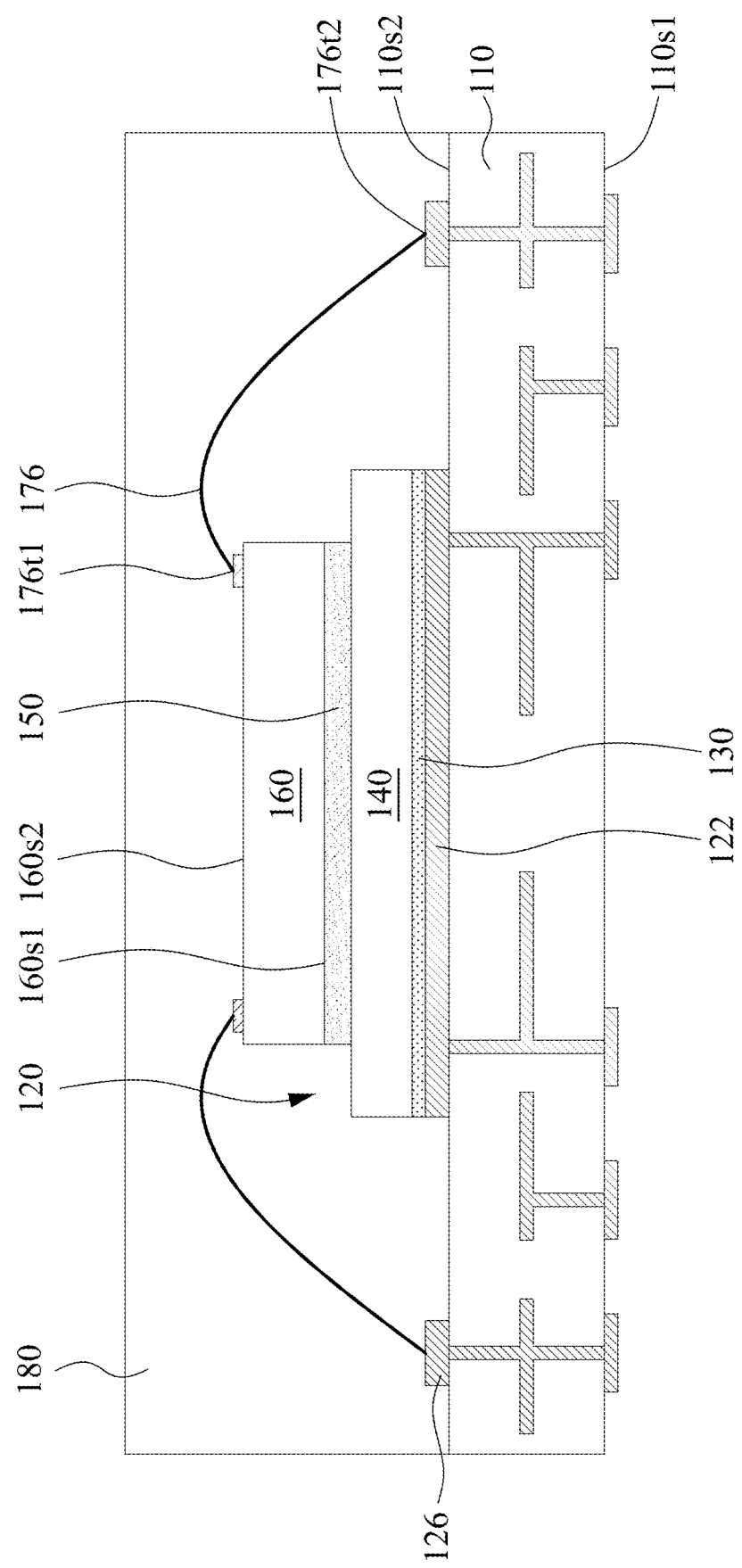
FIG. 12C is a cross-sectional view along line B-B' of the stage as shown in FIG. 12A, in accordance with some embodiments of the present disclosure.
Figure 12D:
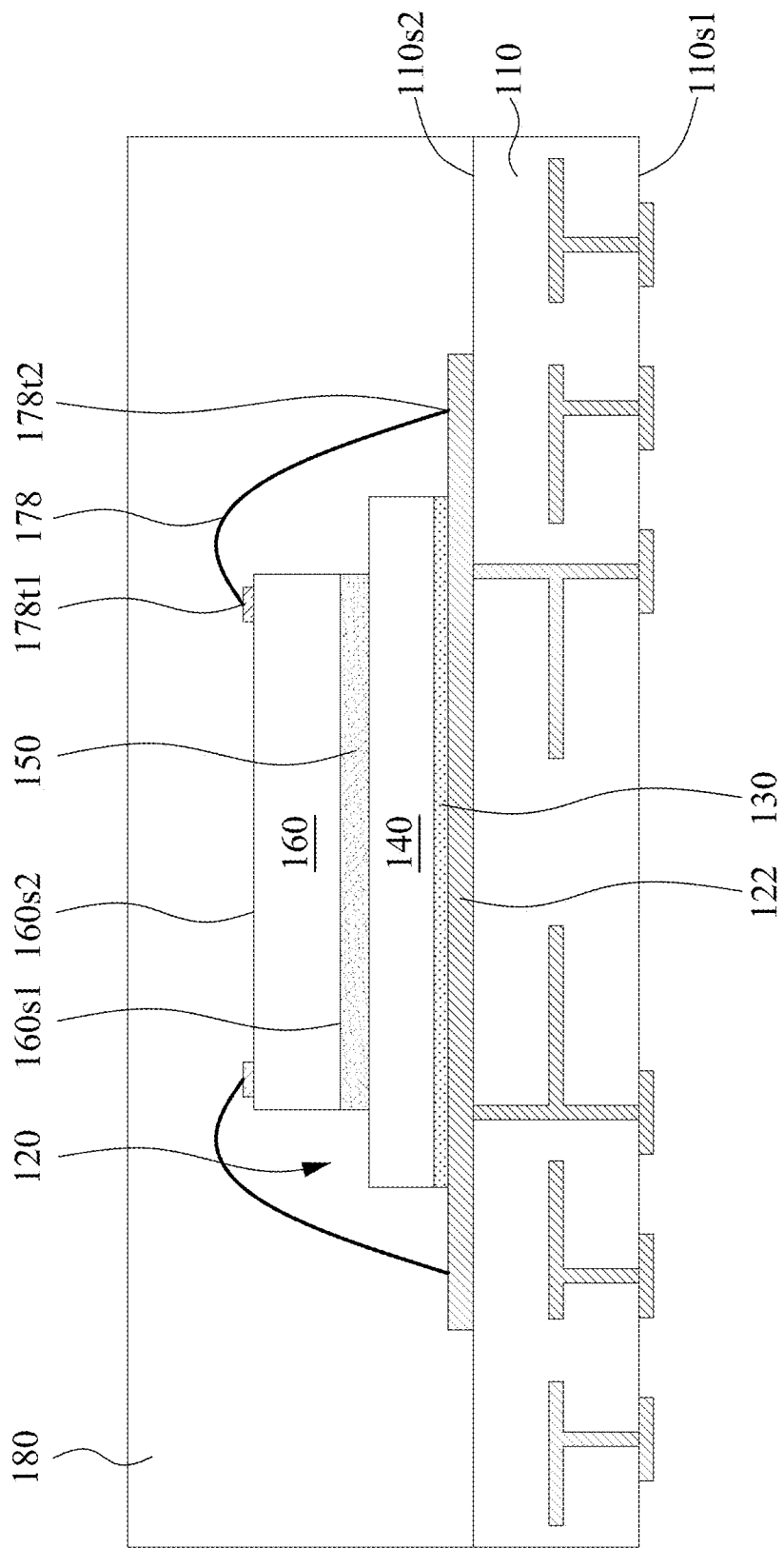
FIG. 12D is a cross-sectional view along line C-C' of the stage as shown in FIG. 12A, in accordance with some embodiments of the present disclosure.
Figure 13A:
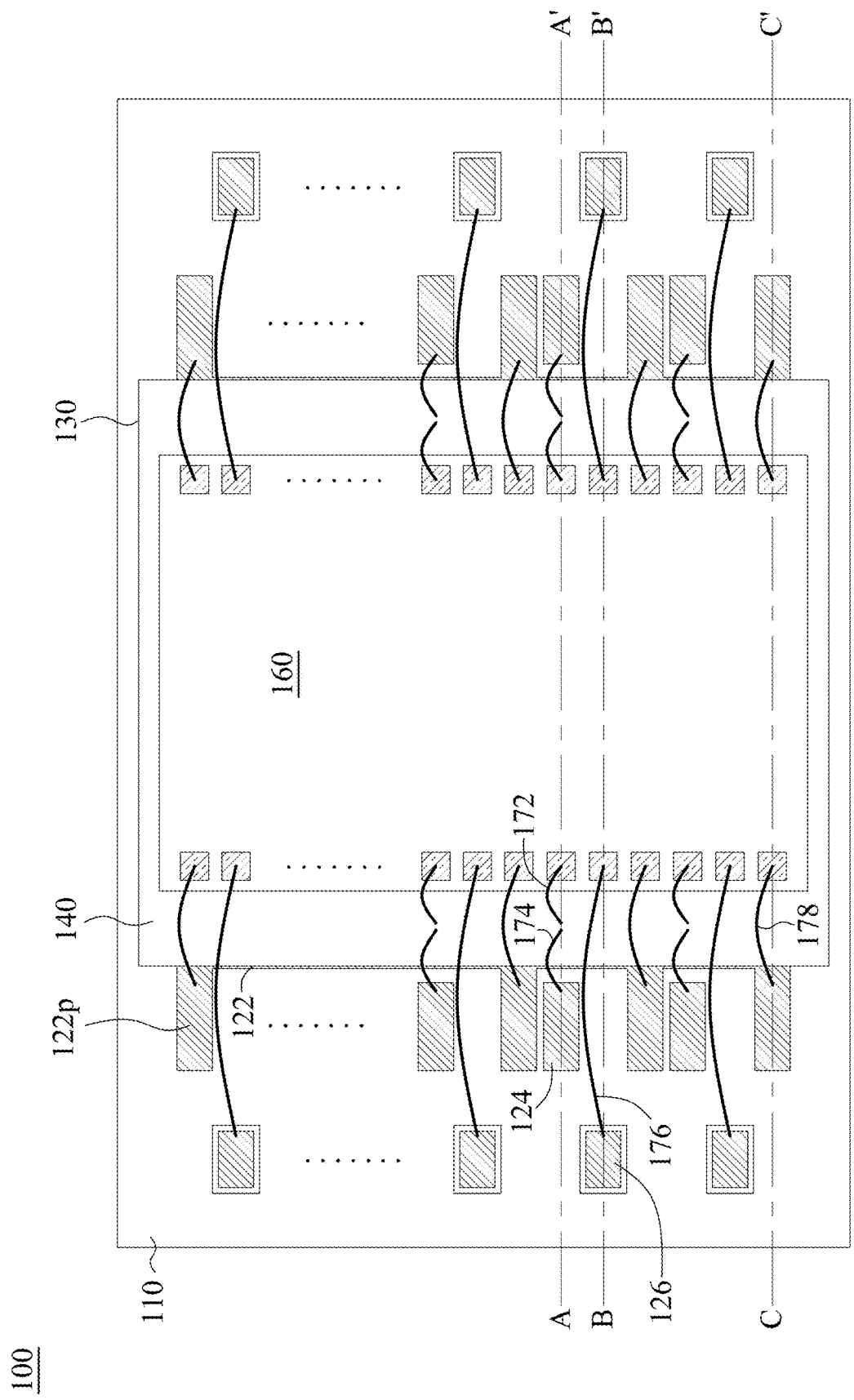
FIG. 13A illustrates one or more stages of an exemplary method for manufacturing a semiconductor device according to some embodiments of the present disclosure.
Figure 13B:
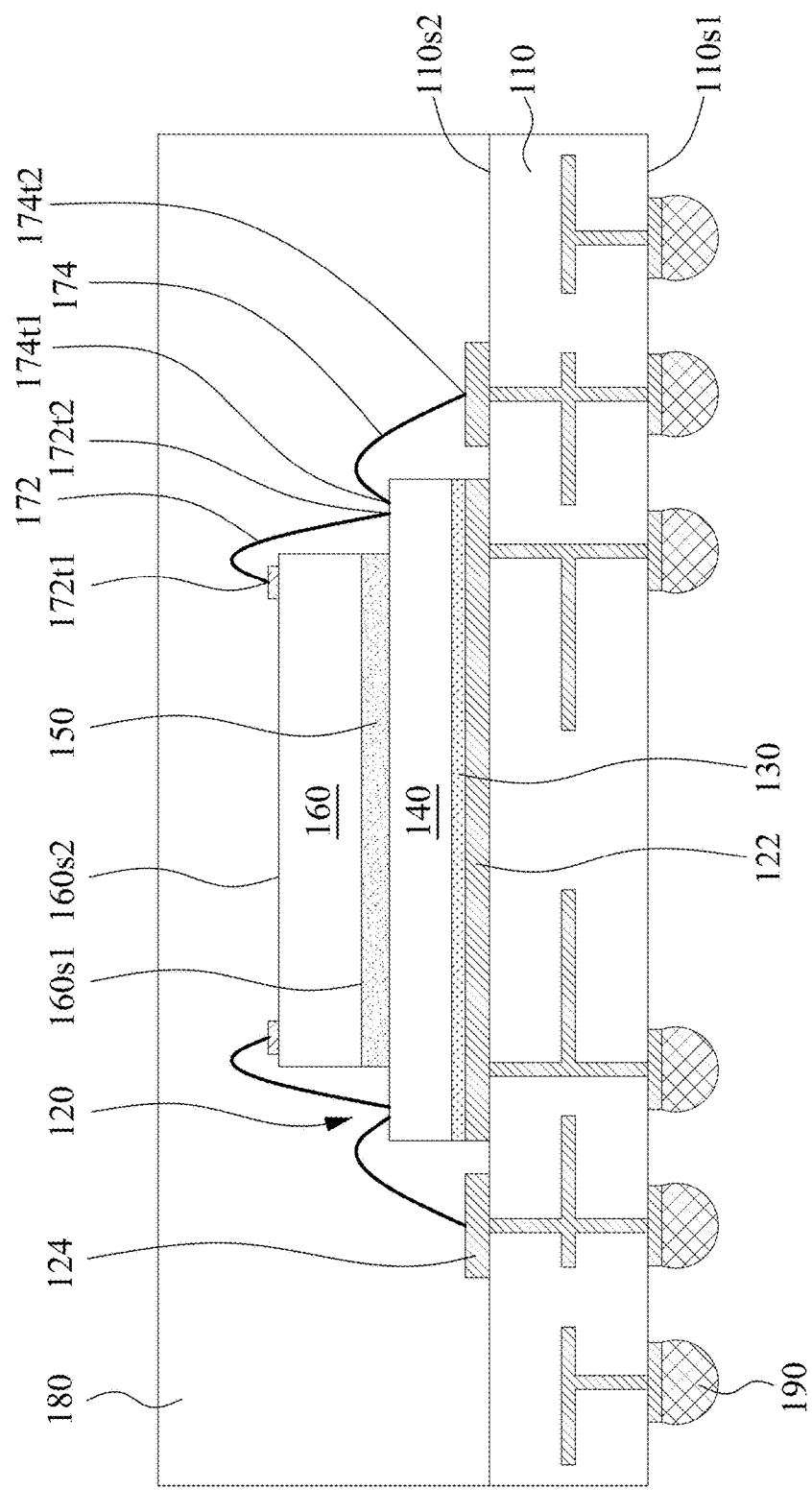
FIG. 13B is a cross-sectional view along line A-A' of the stage as shown in FIG. 13A, in accordance with some embodiments of the present disclosure.
Figure 13C:
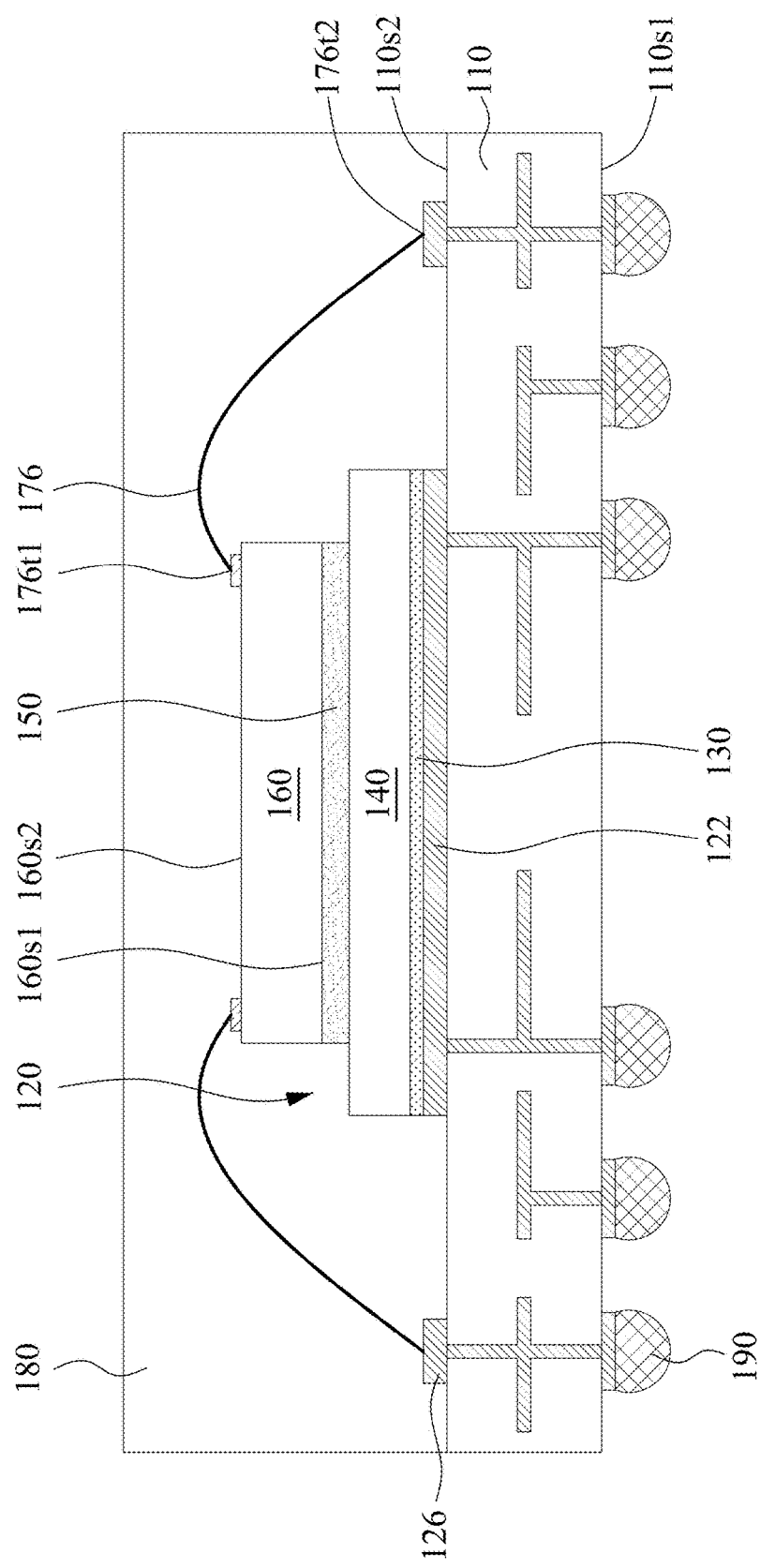
FIG. 13C is a cross-sectional view along line B-B' of the stage as shown in FIG. 13A, in accordance with some embodiments of the present disclosure.
Figure 13D:
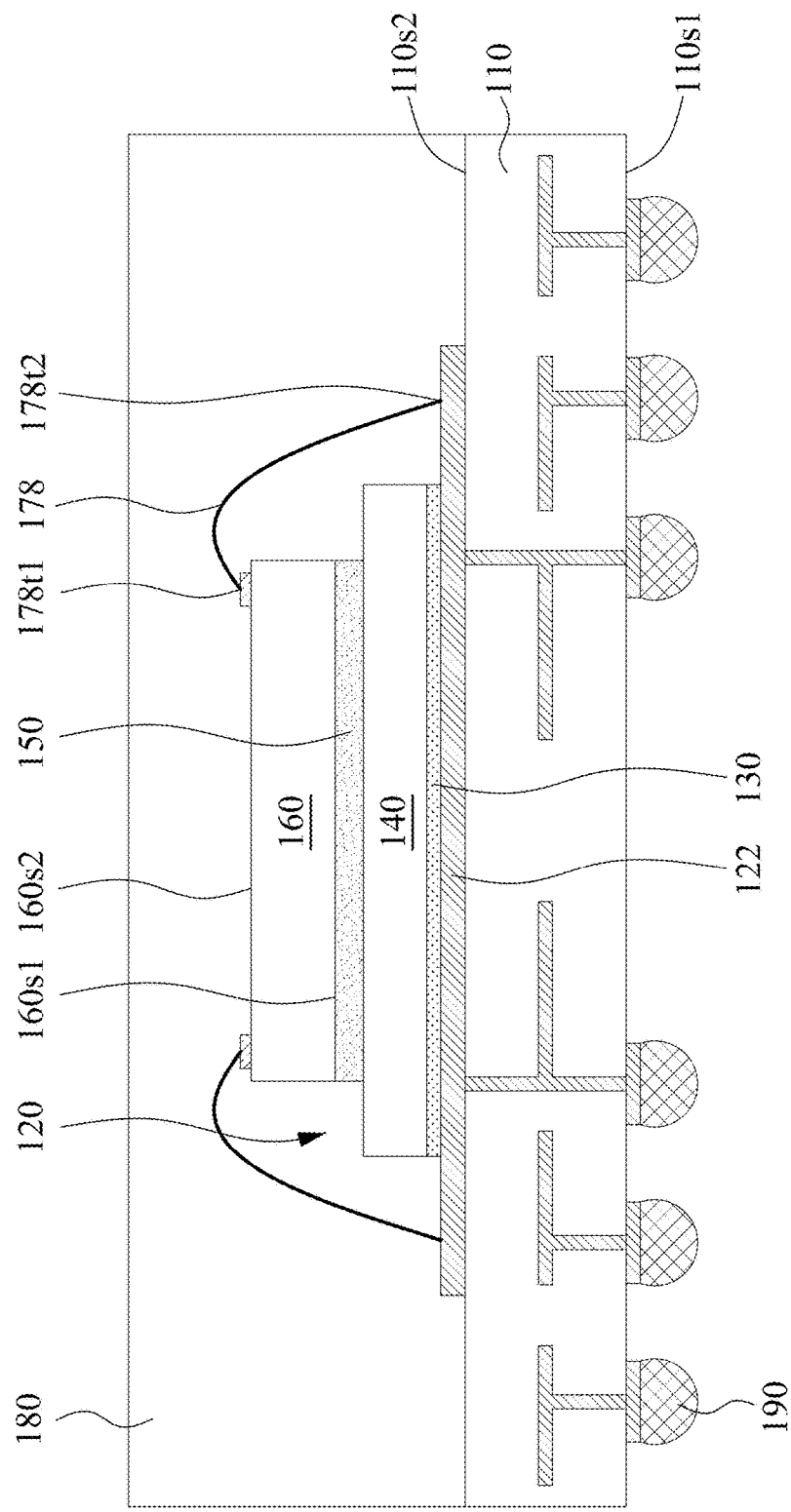
FIG. 13D is a cross-sectional view along line C-C' of the stage as shown in FIG. 13A, in accordance with some embodiments of the present disclosure.

FIG. 4 is a flowchart illustrating a method 400 of manufacturing a semiconductor device, in accordance with some embodiments of the present disclosure.

The method 400 begins with operation 402 in which a substrate may be provided.

The method 400 continues with operation 404 in which a decoupling capacitor structure is formed on the substrate. In some embodiments, forming the decoupling capacitor structure may include forming a first conductive layer on the substrate. In some embodiments, forming the decoupling capacitor structure may include forming a dielectric film on the first conductive layer. In some embodiments, forming the decoupling capacitor structure may include forming a second conductive layer on the dielectric film.

The method 400 continues with operation 406 in which an electronic component is formed on the decoupling capacitor structure.

The method 400 continues with operation 408 in which conductive wires are formed. In some embodiments, the electronic component is electrically connected to the second conductive layer by a first conductive wire. In some embodiments, the electronic component is electrically connected to the first conductive layer by a second conductive wire. In some embodiments, the second conductive layer is electrically connected to a conductive pad over the substrate by a third conductive wire.

The method 400 continues with operation 410 in which an encapsulant is formed. The encapsulant may encapsulate the electronic component. The encapsulant may encapsulate the decoupling capacitor structure. The encapsulant may encapsulate the conductive wires.

The method 400 continues with operation 412 in which electrical connections are formed. The electrical connections may include, for example, a solder material.

The method 400 is merely an example, and is not intended to limit the present disclosure beyond what is explicitly recited in the claims. Additional operations can be provided before, during, or after each operation of the method 400, and some operations described can be replaced, eliminated, or reordered for additional embodiments of the method. In some embodiments, the method 400 can include further operations not depicted in FIG. 4. In some embodiments, the method 400 can include one or more operations depicted in FIG. 4.

FIG. 5A-FIG. 13A illustrate one or more stages of an exemplary method for manufacturing a semiconductor device according to some embodiments of the present disclosure. FIG. 5B-FIG. 13B, FIG. 5C-FIG. 13C, and FIG. 5D-FIG. 13D are cross-sectional views along line A-A', B-B', and C-C' of FIG. 5A-FIG. 13A, respectively. In some embodiments, the semiconductor device 100 may be manufactured through the operations described with respect to FIG. 5A-FIG. 13A.

Referring to FIG. 5A, FIG. 5B, FIG. 5C, and FIG. 5D, a substrate 110 may be provided. The substrate 110 may have a surface 110s1 and a surface 110s2 opposite to the surface 110s1. A conductive layer 122, conductive pad 124, and conductive pad 126 may be formed on the surface 110s2 of the substrate 110. The conductive layer 122 may have a plurality of extending portions 122p. The conductive layer 122 may be electrically connected to ground. The conductive pad 124 and the conductive pad 126 may be electrically connected to different voltages (or power supplies). The conductive pad 126 may be configured to transmit a power signal, such as VDD. The conductive pad 126 may be configured to transmit a data signal.

Referring to FIG. 6A, FIG. 6B, FIG. 6C, and FIG. 6D, a dielectric film 130 may be formed on the surface 110s2 of the substrate 110. In some embodiments, the dielectric film 130 may be formed on the conductive layer 122.

Referring to FIG. 7A, FIG. 7B, FIG. 7C, and FIG. 7D, a conductive layer 140 may be formed on the surface 110s2 of the substrate 110. In some embodiments, the conductive layer 140 may be formed on the dielectric film 130 to produce a decoupling capacitor structure 120. In some embodiments, a lateral surface of the dielectric film 130 may be substantially coplanar with a lateral surface of the conductive layer 140.

Referring to FIG. 8A, FIG. 8B, FIG. 8C, and FIG. 8D, a conductive wire 174 may be formed to electrically connect the conductive layer 140 and the conductive pad 124. The conductive wire 174 may have a terminal 174t1 bonded to the conductive layer 140 and a terminal 174t2 bonded to the conductive pad 124.

Referring to FIG. 9A, FIG. 9B, FIG. 9C, and FIG. 9D, an adhesive layer 150 may be formed on the conductive layer 140.

Referring to FIG. 10A, FIG. 10B, FIG. 10C, and FIG. 10D, an electronic component 160 may be formed on the adhesive layer 150. The electronic component 160 may have a surface 160s1 and a surface 160s2. The surface 160s1 may face the substrate 110. The surface 160s2 may serve as an active surface.

Referring to FIG. 11A, FIG. 11B, FIG. 11C, and FIG. 11D, conductive wires 172, 176, and 178 may be formed. The conductive wire 172 may be configured to electrically connect the electronic component 160 and the conductive layer 140. The conductive wire 172 may have a terminal 172t1 bonded to the electronic component 160 and a terminal 172t2 bonded to the conductive layer 140. The conductive wire 176 may be configured to electrically connect the electronic component 160 and the conductive pad 126. The conductive wire 176 may have a terminal 176t1 bonded to the electronic component 160 and a terminal 176t2 bonded to the conductive pad 126. The conductive wire 178 may be configured to electrically connect the electronic component 160 and the conductive layer 122. The conductive wire 178 may have a terminal 178t1 bonded to the electronic component 160 and a terminal 178t2 bonded to the conductive layer 122.

Referring to FIG. 12A, FIG. 12B, FIG. 12C, and FIG. 12D, an encapsulant 180 may be formed on the surface 110s2 of the substrate 110. The encapsulant 180 may be formed by a molding operation. The encapsulant 180 may encapsulate the decoupling capacitor structure 120 and the electronic component 160.

Referring to FIG. 13A, FIG. 13B, FIG. 13C, and FIG. 13D, electrical connections 190 may be formed on the surface 110s1 of the substrate 110, which thereby produces the semiconductor device 100. The electrical connection 190 may include a solder material.

In embodiments of the present disclosure, an electronic component (e.g., 160) is integrated with or stacked over a decoupling capacitor structure (e.g., 120). The conductive patterns on a substrate may serve as a terminal (e.g., 122) of the decoupling capacitor structure. Such structure may need no additional area, resulting in a relatively small size of a semiconductor device (e.g., 100) in comparison with a comparative example.

One aspect of the present disclosure provides a semiconductor device. The semiconductor device includes a substrate, a decoupling capacitor structure, and an electronic component. The decoupling capacitor structure is disposed on the substrate. The electronic component is disposed on the decoupling capacitor structure and electrically connected to the decoupling capacitor structure. The electronic component is stacked over the decoupling capacitor structure.

Another aspect of the present disclosure provides another semiconductor device. The semiconductor device includes a substrate; a first conductive layer, a dielectric film, a second conductive layer, and an electronic component. The first conductive layer is disposed on the substrate and configured to be electrically connected to a first voltage. The dielectric film is disposed on the first conductive layer. The second conductive layer is disposed on the dielectric film and configured to be electrically connected to a second voltage different from the first voltage. The electronic component is electrically connected to the second conductive layer.

Another aspect of the present disclosure provides a method of manufacturing a semiconductor device. The method includes providing a substrate. The method also includes forming a decoupling capacitor structure on the substrate. The method further includes forming an electronic component on the decoupling capacitor structure. The electronic component is stacked on the decoupling capacitor structure.

In embodiments of the present disclosure, the semiconductor device may include a decoupling capacitor structure, which may be configured to filter signals transmitted to or from the electronic component. The electronic component may be stacked on at least a portion of the decoupling capacitor structure. The conductive patterns over a substrate may serve as a terminal of the decoupling capacitor structure. Such structure may need no additional area, resulting in a relatively small size of a semiconductor device in comparison with a comparative example.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate;
   a decoupling capacitor structure disposed on the substrate, and comprising a first conductive layer, a second conductive layer, and a dielectric film, wherein the second conductive layer has a ring-shaped profile from a top view;
   an electronic component disposed on the decoupling capacitor structure and electrically connected to the decoupling capacitor structure;
   a first conductive wire forming a first direct electrical connection between the electronic component and the first conductive layer; and
   a second conductive wire forming a second direct electrical connection between the electronic component and the second conductive layer,
   wherein the electronic component is stacked over the decoupling capacitor structure.

2. The semiconductor device of claim 1, wherein the substrate is directly in contact with the decoupling capacitor structure.

3. The semiconductor device of claim 1, wherein the first conductive layer is disposed on the substrate, the dielectric film is disposed on the first conductive layer, and the second conductive layer is disposed on the dielectric film,
   wherein the first conductive layer is electrically connected to ground.

4. The semiconductor device of claim 3, further comprising:
   a first conductive pad disposed on the substrate; and
   a third conductive wire electrically connecting the first conductive pad and the second conductive layer.

5. The semiconductor device of claim 3, wherein a portion of the first conductive layer is exposed from the second conductive layer.

6. The semiconductor device of claim 1, wherein the first conductive layer has an extending portion to which the first conductive wire is attached.

7. The semiconductor device of claim 3, further comprising:
   an encapsulant encapsulating the electronic component and the decoupling capacitor structure.

8. The semiconductor device of claim 7, wherein a portion of the encapsulant is disposed between the electronic component and the dielectric film of the decoupling capacitor structure.

9. The semiconductor device of claim 7, wherein a portion of the encapsulant is disposed between the electronic component and the second conductive layer of the decoupling capacitor structure.

10. A semiconductor device, comprising:
    a substrate;
    a first conductive layer disposed on the substrate and configured to be electrically connected to a first voltage;
    a dielectric film disposed on the first conductive layer;
    a second conductive layer disposed on the dielectric film and configured to be electrically connected to a second voltage different from the first voltage wherein the second conductive layer has a ring-shaped profile from a top view;

an electronic component electrically connected to the second conductive layer;

a first conductive wire forming a first direct electrical connection between the electronic component and the second conductive layer; and a second conductive wire forming a second direct electrical connection between the electronic component and the first conductive layer.

11. The semiconductor device of claim 10, wherein the first conductive layer, the dielectric film, and the second conductive layer are configured to define a decoupling capacitor structure.

12. The semiconductor device of claim 10, further comprising:

a third conductive wire electrically connecting the substrate and the second conductive layer.

13. The semiconductor device of claim 10, wherein the first conductive layer is electrically connected to ground.

14. The semiconductor device of claim 11, further comprising:

an encapsulant encapsulating the electronic component and the decoupling capacitor structure, wherein a portion of the encapsulant is disposed between the electronic component and the dielectric film of the decoupling capacitor structure.

15. A method of manufacturing a semiconductor device comprising:

providing a substrate;

forming a decoupling capacitor structure on the substrate, wherein the decoupling capacitor structure comprises a first conductive layer, a second conductive layer, and a dielectric film; and forming an electronic component on the decoupling capacitor structure, wherein the electronic component is stacked on the decoupling capacitor structure, wherein the first conductive layer is disposed on the substrate, the dielectric film is disposed on the first conductive layer, and the second conductive layer is disposed on the dielectric film and surrounds the electric component, wherein the second conductive layer has a ring-shaped profile from a top view.

16. The method of claim 15, wherein the first conductive layer is electrically connected to ground.

* * * * *